United States Patent [19]

Miyamoto et al.

[11] Patent Number: 5,027,323
[45] Date of Patent: Jun. 25, 1991

[54] WRITE PULSE SIGNAL GENERATING CIRCUIT FOR A SEMICONDUCTOR MEMORY DEVICE

[75] Inventors: Kazuhisa Miyamoto; Shuuichi Miyaoka; Kazuo Nakamura; Kenji Imai, all of Tokyo, Japan

[73] Assignee: Hitachi, Ltd., Tokyo, Japan

[21] Appl. No.: 294,675

[22] Filed: Jan. 9, 1989

[30] Foreign Application Priority Data

Jan. 14, 1988 [JP] Japan ................... 63-6230
Mar. 1, 1988 [JP] Japan ................... 63-48481

[51] Int. Cl.⁵ .................... G11C 7/00; H03K 19/02; H03K 3/017; H03K 5/04
[52] U.S. Cl. ................ 365/189.11; 365/174; 365/177; 307/446; 307/267
[58] Field of Search .............. 365/189.11, 194, 177, 365/210; 307/446, 267

[56] References Cited

U.S. PATENT DOCUMENTS

| | | | |
|---|---|---|---|
| 3,641,519 | 2/1972 | Ashley | 365/210 |
| 4,337,523 | 6/1982 | Hotta et al. | 365/194 |
| 4,435,793 | 5/1984 | Ochii | 365/210 |
| 4,697,109 | 9/1987 | Honma et al. | 307/446 |
| 4,713,796 | 12/1987 | Ogiue et al. | 365/189 |
| 4,802,126 | 1/1989 | Takayama | 365/177 |
| 4,829,479 | 5/1989 | Mitsumoto et al. | 365/177 |

FOREIGN PATENT DOCUMENTS 308789 6/1987 Japan .
250583 10/1987 Japan .

OTHER PUBLICATIONS

Ogiue et al., "13-ns, 500-mW, 64-kbit ECL RAM Using HI-BICMOS Technology", IEEE Journal of Solid-State Circuits vol. SC-21, No. 5, Oct. 1986, pp. 681-685.

Kitsukawa et al., "An Experimental 1-Mbit BiCMOS RAM," IEEE Journal of Solid-State Circuits, vol. SC-22, No. 5, Oct. 1987, pp. 657-661.

Primary Examiner—Stuart N. Hecker
Assistant Examiner—Michael A. Whitfield
Attorney, Agent, or Firm—Antonelli, Terry, Stout & Kraus

[57] ABSTRACT

A semiconductor integrated circuit device includes a pulse width expander circuit for expanding the pulse width of a pulse signal of the ECL (emitter coupled logic) level that has a very narrow pulse width, a level conversion circuit for converting the output signal of the ECL level of the pulse width expander circuit into a CMOS (complementary metal oxide semiconductor) level, and an internal circuit that is so connected as to receive the output signal of the level conversion circuit. In other words, the pulse signal having a narrow pulse width is expanded to have a pulse width which is sufficient for the level conversion circuit prior to performing the level conversion operation. Therefore, the level of the pulse signals having narrow pulse widths is stably converted.

13 Claims, 7 Drawing Sheets

WRITE PULSE SIGNAL GENERATING CIRCUIT FOR A SEMICONDUCTOR MEMORY DEVICE

BACKGROUND OF THE INVENTION

The present invention relates to a semiconductor integrated circuit device, such as technology that can be applied particularly effectively to a memory or the like with logic functions constituted based upon a bipolar CMOS-type RAM (random access memory) of an ECL (emitter coupled logic) interface.

When a high-speed computer system is to be constituted, in general, signals of an ECL level are exchanged between a central processing unit (CPU) and storage devices. Signals of the ECL level have an amplitude which is as small as 0.8 volts that the logic high level (or logic low level) can be changed into the logic low level (or logic high level) within a short period of time.

A bipolar static RAM (or an ECL RAM) has been known as a high-speed semiconductor memory device that can be used for the above-mentioned high-speed computer system. The bipolar RAM has memory cells constituted by bipolar transistors and peripheral circuits, and wherein the input/output interface has signals of the ECL levels.

Japanese Patent Laid-Open No. 250583/1987 (laid-open date: Oct. 31, 1987, inventors: Usami et al., assignee: Hitachi, Ltd.) discloses a bipolar static-type RAM having latch circuits for latching address signals of the ECL level supplied from an external unit and a write control signal $\overline{WE}$ and a signal forming circuit for forming an internal write pulse based upon the latched write control signal $\overline{WE0}$ in order to write the data at a high speed into the memory cell of the bipolar-type static RAM.

In recent years, research has been forwarded vigorously to develop semiconductor memory devices constituted by the combination of bipolar transistors and a CMOS (complementary MOS) circuit. U.S. Pat. No. 4,713,796 teaches a static RAM constituted by bipolar transistors and CMOS circuits. A bipolar CMOS static-type RAM of an ECL I/O signal interface has been disclosed in Ogiue et al., "13 nS 500 mW, 64-Kbit ECL RAM Using Hi-BiCMOS Technology", IEEE Journal of Solid-State Circuits, Vol. SC-21, No. 5, October, 1986, pp. 681-685. Further, a dynamic-type RAM employing bipolar transistors and CMOS circuits have been disclosed in Kitsukawa et al., "An Experimental 1-Mbit BiCMOS DRAM", IEEE Journal of Solid-State Circuits, Vol. SC-22, No. 5, October, 1987, pp. 657-661. In these static RAM and dynamic RAM, the memory cells are formed by CMOS technology. Therefore, the memory cells consume small amounts of electric power, and are highly densely integrated, and have a large capacity. That is, the peripheral circuits consume small amounts of electric power and operate at a high speed such that the peripheral circuits thereof can be formed by the combination of the bipolar transistors and the CMOS circuits.

As described above, a semiconductor memory of the ECL I/O signal interface is advantageous for operating the computer system at high speeds, and it is desired that the semiconductor memory based on the bipolar-CMOS technology also has the ECL I/O signal interface. In fact, the theory announced by Ogiue et al. deals with a bipolar CMOS static RAM of the ECL I/O signal interface. Here, attention should be given to the fact that in the static RAM based on the bipolar CMOS technology, the internal memory cells are constituted by the CMOS technology and whereby it becomes necessary to convert the input signals of the ECL level into the internal signals of the MOS level, i.e., to convert the input signals of the ECL level into the internal signals of a level having an amplitude nearly equal to the power source voltage of the circuit.

The write cycle time and the read cycle time of the semiconductor memory device used for the computer system are shortened with the increase in the operation speed of the computer system. Therefore, it becomes difficult to realize various timing conditions for the control signals of the ECL level such as write control signals $\overline{WE0}$ that are input from the central processing unit or the like to the semiconductor memory devices.

SUMMARY OF THE INVENTION

In view of the above-mentioned situations, the present inventors have studied a memory with logic functions that includes a bipolar CMOS-type RAM and that can be applied to a high-speed computer system, and have discovered problems that develop in further increasing the speed of operation as described below.

That is, in the memory with logic functions constituted based upon a bipolar CMOS-type RAM discussed by the present inventors, a write control signal input from an external unit is supplied as a write pulse, i.e., a write enable signal WE is supplied as a write pulse to the write amplifier. Therefore, the write enable signal WE must have a pulse width which is sufficient for the write amplifier to stably operate, and must have a predetermined set-up time and a hold time for the address signals and write data that are input. It was found that the timing conditions for the write enable signal WE become strict as the memory with logic functions operates at high speeds and the cycle time becomes short, and become difficult to realize. Therefore, the present inventors have developed a memory with logic functions in which the input operation is synchronized with clock signals to autonomously form the write pulses therein that satisfy the above-mentioned timing conditions. FIG. 1 illustrates part of the memory with logic functions developed by the present inventors.

In the memory with logic functions, the write enable signals WE supplied from the external unit are received by an input latch BF2 in response to inverted clock signals $\overline{CP}$ simultaneously with the receipt of address signals and input write data. An inverted output signal we of the input latch BF2 is subjected to the AND operation by a NOR gate circuit BG1 consisting of bipolar transistors together with a delay signal of an inverted clock signal $\overline{CP}$, i.e., together with an inverted delay clock signal $\overline{dcp}$ maintaining a negative logic. An inverted internal signal $\overline{wc}$ of the ECL level is thus formed. The inverted internal signal $\overline{wc}$ of the ECL level is converted into the one of the CMOS (complementary MOS) level through a level conversion circuit LC that includes a MOS current mirror circuit thereby to form an internal signal mwc. The internal signal mwc is supplied to a write pulse generating circuit WPG that includes a CMOS logic circuit. The write pulse generating circuit WPG forms a write pulse of the CMOS level, i.e., forms an inverted timing signal $\overline{\phi w}$ that satisfies the above timing conditions based on the internal signal mwc, and supplies it to the write amplifier WA.

It was, however, found by the present inventors that the below-mentioned problems take place in the above-mentioned pulse generating circuit as the memory with logic functions operates at high speeds. That is, as the memory with logic function operates at high speeds, the inverted clock signal $\overline{CP}$ supplied to the timing generating circuit TG acquires a period and a pulse width that are shortened to a degree accomplished by the operation limit of the ECL circuit. As the pulse width of the inverted clock signal $\overline{CP}$ is narrowed, furthermore, the pulse width of the inverted internal signal $\overline{wc}$ formed based thereupon is narrowed, too. Therefore, the level conversion circuit LC consisting of a MOS current mirror circuit becomes no more possible to form the internal signal mwc having a predetermined CMOS level following the inverted internal signal $\overline{wc}$. That is, the signal level of the internal signal $\overline{wc}$ changes while the level conversion circuit LC is converting the level in response to the internal signal $\overline{wc}$. Therefore, the level conversion circuit LC discontinues the level conversion operation and does not form a signal mwc having the level which is converted sufficiently. As a result, the write pulse generating circuit WPG that operates in response to the internal signal mwc becomes no more possible to form a write pulse that is adapted to the above timing conditions. Therefore, the memory with logic function fails to properly carry out the write operation and loses reliability.

It was further clarified by the present inventors that the above-mentioned write pulse generating circuit involves problems as described below. That is, the delay time of the delay circuit included in the write pulse generating circuit WPG is affected by the manufacturing process. Similarly, characteristics of the memory cells which perform the write operation in response to write pulses are affected by the manufacturing process. Therefore, the delay time of the delay circuit is determined with reference to the operation characteristics of the memory cells in the step of developing the memory having logic functions. In practice, however, delay time of the delay circuit and characteristics of the memory cells vary depending upon the variance in the manufacturing process. Therefore, it becomes necessary to set the timing margin of the write pulse to a large value, which prevents the memory with logic functions from operating at high speeds. In order to avoid this problem, furthermore, if the delay time of the delay circuit is set to meet the operation characteristics of memory cells of each of the products, many test steps are required for measuring the delay time and for determining the operation characteristics of the memory cells, making it difficult to reduce the manufacturing cost of the memory with logic functions.

The object of the present invention is to provide a semiconductor memory device that is capable of effecting the write operation at high speeds.

Another object of the present invention is to stabilize the operation of the pulse generating circuit that includes the ECL-CMOS level converter circuit.

A further object of the present invention is to prevent the erroneous operation of the memory having logic functions that includes the above-mentioned pulse generating circuit.

Still further object of the present invention is to provide a write pulse generating circuit that is capable of efficiently setting the pulse width of the write pulses corresponding to the operation characteristics of the memory cells.

Yet further object of the present invention is to provide a memory with logic functions including the write pulse generating circuit, that operates at high speeds and that can be produced at a reduced cost.

Among the inventions disclosed in this application, a representative example will be briefly described below That is, a very narrow pulse width of a clock signal or a pulse width of an internal signal formed in response thereto is expanded by a pulse width expander means, and the internal signal having an expanded pulse width is supplied to the level conversion circuit. According to the above-mentioned means, the level conversion circuit performs the level conversion operation in response to an internal signal having an expanded pulse width. Therefore, the time of level conversion operation is increased by the expanded amount of the pulse width. Hence, the level of the internal singal that is supplied changes after the level of the internal signal is sufficiently converted by the level conversion circuit. Accordingly, the signal level of the internal signal can be reliably converted by the level conversion circuit into a predetermined signal level. Operation of the write pulse generating circuit, therefore, is stabilized, and the memory with logic functions including the write pulse generating circuit is prevented from operating erroneously.

Furthermore, a dummy cell that will be latched like the memory cells is formed in the memory array, and a write pulse generating circuit is constituted by the dummy cell and by the delay circuit that forms a reset signal in response to the output signal from the dummy cell The delay time of the delay circuit is determined with reference to the operation characteristic of the dummy cell.

According to the above-mentioned means, the pulse width of the write pulse produced from the write pulse generating circuit is determined with reference to the operation characteristic of the dummy cell of the latch form that is the same as the operation characteristics of the memory cells. In other words, the pulse width of the write pulse can be efficiently set in response to operation characteristics of the memory cells of each of the devices. This makes it possible to decrease the number of testing steps for determining the characteristics of the memory cells and for measuring the delay time of the delay circuit, and to produce the memory with logic functions at a reduced cost. Furthermore, the pulse width of the write pulse is optimized according to the operation characteristics of the memory cells, and the timing margin is reduced, so that the memory with logic functions can be operated at high speeds.

DETAILED DESCRIPTION OF THE PREFERRED EMBODIMENTS

Embodiment 1

Figure 2:
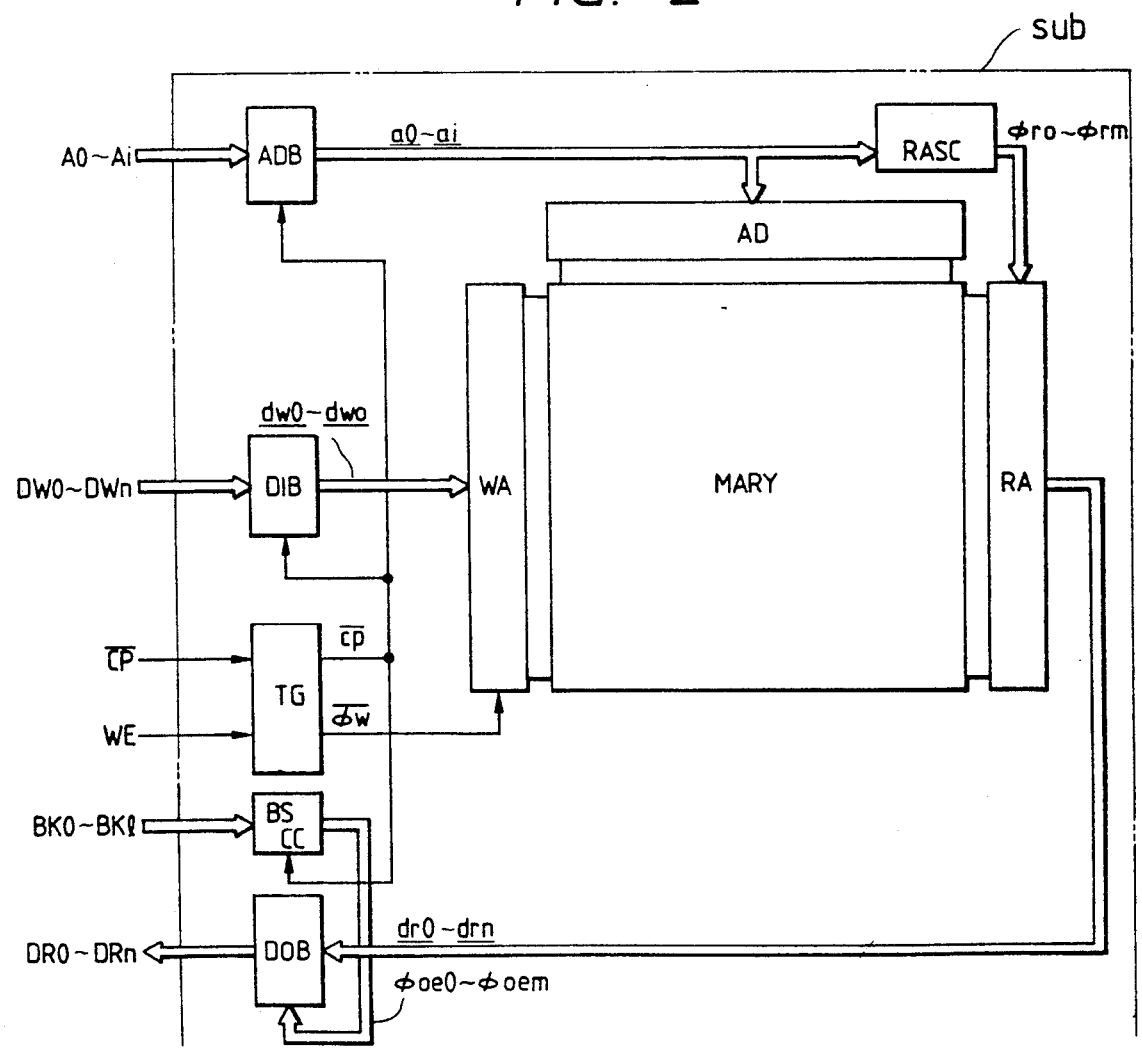
FIG. 2 is a block diagram of the memory with logic functions according to an embodiment.

FIG. 2 is a simple block diagram illustrating an embodiment of a memory with logic functions to which the present invention is applied Though there is no particular limitation, the memory with logic functions of this embodiment is constituted based upon a bipolar CMOS-type RAM and includes a logic unit such as latch circuit The circuit elements constituting the blocks of FIG. 2 are formed on a semiconductor substrate Sub such as of single crystalline silicon together with circuit elements that constitute a logic unit of the memory having logic functions.

Though there is no particular limitation, the memory with logic functions of this embodiment is served with address signals A0 to Ai of i+1 bits, write data DW0 to DWn of n+1 bits, and a write enable signal (write control signal) WE from an external unit. The memory with logic functions is further served with inverted clock signals $\overline{CP}$ of a predetermined period from the external unit. In response to the inverted clock signals $\overline{CP}$, the memory with logic functions receives the address signals A0 to Ai, write data DW0 to DWn and write enable signal WE through the corresponding latches. That is, the input operation of the memory with logic functions of this embodiment is synchronized in accordance with the inverted clock signals $\overline{CP}$. The timing generating circuit TG further includes a write pulse generating circuit WPG that forms a write pulse, i.e., an inverted timing signal $\overline{\phi w}$ which satisfies the predetermined timing conditions in response to a write enable signal WE received through the corresponding latch. The input latch and the write pulse generating circuit WPG will be described later in detail.

In the memory with logic functions of this embodiment, the write enable signal WE and the inverted clock signal $\overline{CP}$ assumes the ECL level as described earlier, and the inverted timing signal $\overline{\phi w}$ produced from the write pulse generating circuit WPG assumes the CMOS level. Further, the inverted clock signal $\overline{CP}$ has a pulse width that is narrowed to a degree that is achieved by the operation limit of the ECL circuit. For instance, the pulse width is about 1.1 ns. Therefore, the inverted clock signal $\overline{CP}$ has a pulse width that is expanded to about 2 ns by the pulse width expander circuit PWE but without changing its ECL level, and is then combined with the write enable signal WE thereby to form the internal signal of the ECL level. The internal signal is converted into the one of the CMOS level through the level conversion circuit LC that will be described later and is transmitted to the write pulse generating circuit WPG. Therefore, operations of the level conversion circuit LC and the write pulse generating circuit WPG are stabilized, and the memory with logic functions is prevented from being operated erroneously.

In FIG. 2, the memory array MARY includes a plurality of word lines that are arranged in parallel with each other in the vertical direction, a plurality of complementary data line pairs that are arranged in parallel with each other in the horizontal direction, and a plurality of memory cells connected to these word lines and complementary data line pairs.

The word lines constituting the memory array MARY are connected to the address decoder AD and are selected alternatively.

The address decoder AD is served with non-inverted internal address signals $\overline{a0}$ to ai and inverted internal address signals a0 to $\overline{ai}$ that are sent from the address buffer ADB that will be described later. The non-inverted and inverted internal address signals $\overline{a0}$ to ai and a0 to $\overline{ai}$ are hereinafter indicated as internal address signals $\underline{a0}$ to ai.

When in operation, the address decoder AD decodes the complementary internal address signals $\underline{a0}$ to ai, and alternatively selects the corresponding word lines of the memory array MARY so that they will assume the high level.

The address buffer ADB includes input latches of a number of i+1. The input latches are commonly served with timing signals $\overline{cp}$ from the timing generating circuit TG.

The input latches of the address buffer ADB receive the address signals A0 to Ai in response to the timing signals $\overline{cp}$ and hold them. Further, the complementary internal address signals $\underline{a0}$ to ai are formed based on these address signals A0 to Ai, and are supplied to the address decoder AD.

The plurality of complementary data line pairs constituting the memory array MARY are divided into a plurality of groups, and the complementary data line pairs in each group are connected to a corresponding unit circuit of the write amplifier WA and to a corresponding unit circuit of the read amplifier RA.

Though there is no particular limitation, the write amplifier WA includes unit circuits of a number of n+1. These unit circuits are served with corresponding complementary internal write data $\underline{dw0}$ to dwn from a data input buffer DIB that will be described later. Further, a write pulse, i.e., an inverted timing signal $\overline{\phi w}$ is commonly supplied thereto from the timing generating circuit TG. As will be described later, the inverted timing signal $\overline{\phi w}$ assumes the high level when the memory with logic functions is not selected. When the memory with logic functions is selected, the inverted timing signal $\overline{\phi w}$ temporarily assumes the low level at a predetermined timing provided the write enable signal WE has the high level.

The unit circuits of the write amplifier WA are selectively operated when the inverted timing signal $\overline{\phi w}$ has the low level Under this operation condition, the unit circuits of the write amplifier WA form complementary write signals in accordance with the complementary internal write data $\underline{dw0}$ to dwn supplied from the data input buffer DIB, and supply them to the corresponding complementary data lines of the memory array MARY. These write signals are sent, via the corresponding complementary data lines, to memory cells of a number of n+1 that are connected to the selected word lines of the memory array MARY.

The data input: buffer DIB includes input latches of a number of n+1. These input latches are commonly served with the timing signals $\overline{cp}$ sent from the timing generating circuit TG.

The input latches of the data input buffer DIB receive write data DW0 to DWn sent from an external unit in response to the timing signals cp, and hold them. Further, the data input buffer DIB forms the complementary internal write data dw0 to dwn based on the write data DW0 to DWn, and supplies them to the corresponding unit circuits of the write amplifier WA.

The read amplifier RA includes unit circuits of a number of n+1. The unit circuits are served with timing signals $\phi_{r1}$ to $\phi_{rn}$ from a read amplifier select circuit RASC that will be described later.

The unit circuits of the read amplifier RA are selectively operated when the corresponding timing signals $\phi_{r1}$ to $\phi_{rn}$ have the high level. Under the operation condition, the unit circuits of the read amplifier RA amplify the read signals that are read, via the corresponding complementary data lines, from n+1 memory cells connected to the selected word lines of the memory array MARY, in order to form complementary internal read data dr0 to drn. The complementary internal read data dr0 to drn are supplied to the corresponding output circuits of the data output buffer DOB that will be described later.

Though there is no particular limitation, the data output buffer DOB includes output circuits of a number of n+1. These output circuits are served with the corresponding complementary internal read data dr0 to drn from the above read amplifier RA. A block select control circuit BSCC that will be described later sends timing signals $\phi_{oe0}$ to $\phi_{oen}$ to the corresponding output circuits.

The output circuits of the data output buffer DOB are selectively operated when the timing signals $\phi_{oe0}$ to $\phi_{oen}$ temporarily assume the high level. Under this operation condition, the output circuits of the data output buffer DOB form read data DR0 to DRn based on the corresponding internal read data dr0 to drn, and send them to an external unit. When the timing signals $\phi_{oe0}$ to $\phi_{oen}$ have the low level, the output circuits of the data output buffer DOB produce outputs under the high impedance condition.

The timing generating circuit TG forms the timing signal $\overline{\phi w}$ based on the inverted clock signal $\overline{CP}$ sent from an external unit and the write enable signal WE, and supplies it to the circuits. The timing generating circuit TG includes an input latch that receives and holds the write enable signal WE. The input latch is triggered by the inverted clock signal $\overline{CP}$, and is selectively set or reset according to the write enable signal WE. The inverted timing signal $\overline{\phi w}$ is selectively formed according to the output signal of the input latch.

The block select control circuit BSCC forms timing signals $\phi_{oe0}$ to $\phi_{oen}$ based on block select signals Bk0 to Bkl sent from an external unit. The block select control circuit BSCC includes latch circuits of a number of l+1 to latch the block select signals Bk0 to Bkl. The latch circuits hold the block select signals Bk0 to Bk1 in response to inverted clock signals $\overline{CP}$ sent from the timing generating circuit TG.

The block select control circuit BSCC forms timing signals to $\phi_{oen}$ to $\phi_{oen}$ based on the output signals of the l+1 latch circuits It can be considered that the memory array MARY is divided into a plurality of blocks. That is, blocks from which the data are to be read are designated by selectively and temporarily rendering part of the timing signals $\phi_{oe0}$ to $\phi_{oen}$ to assume the high level. Therefore, the bit number of the data read out can be varied.

The read amplifier select circuit RASC forms timing signals $\phi_{r0}$ to $\phi_{rn}$ upon receiving part of the complementary internal address signals a0 to ai that are supplied from the address buffer circuit ADB. The circuit constitution of the read amplifier select circuit RASC is so selected that the unit circuits in the read amplifier RA can be all operated simultaneously or that only some of the unit circuits can be operated.

Figure 3:
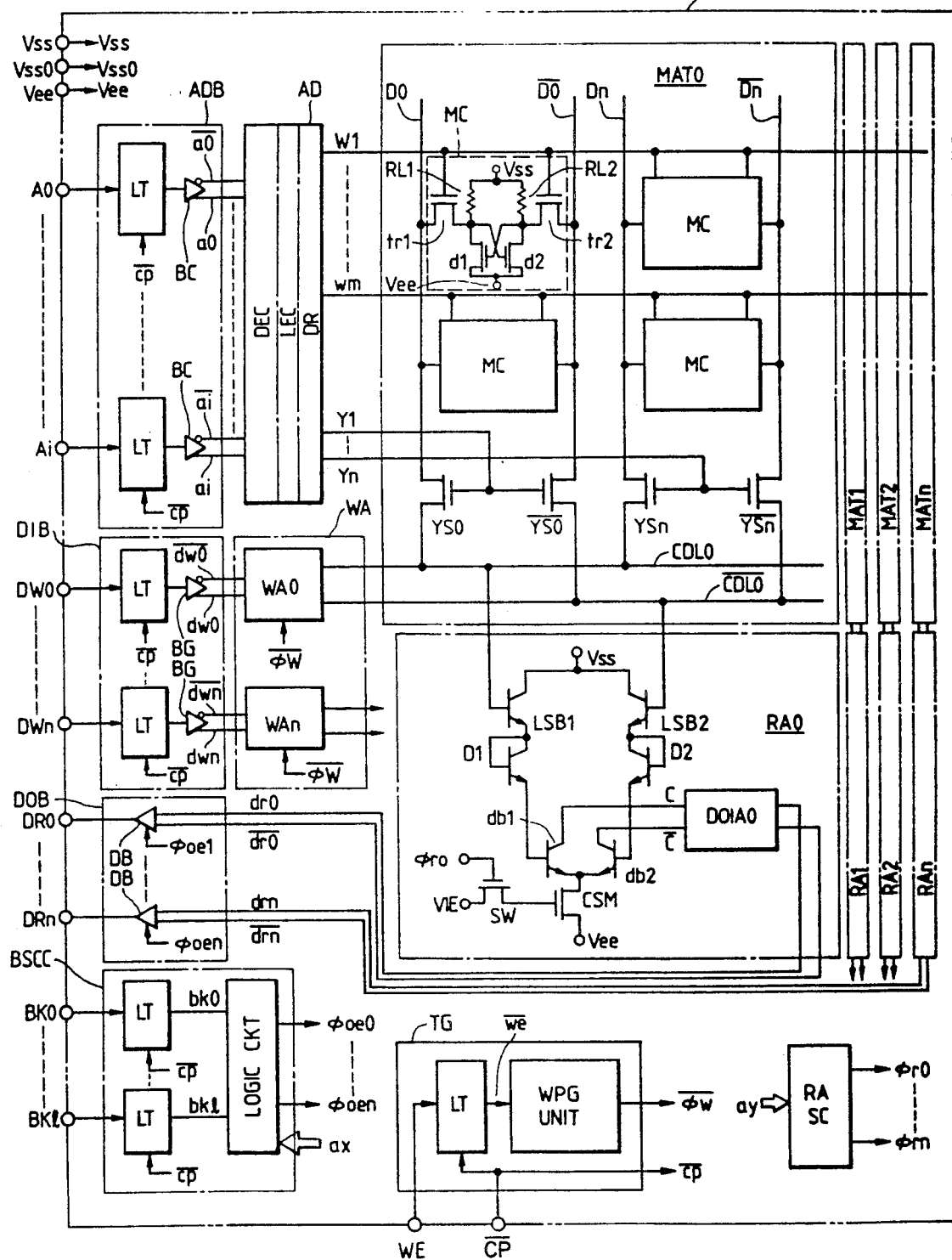
FIG. 3 is a diagram showing in detail the circuit of FIG. 2.

FIG. 3 illustrates in detail the block diagram of FIG. 2. Hereinafter, the invention will be described in conjunction with FIG. 3. The portions that may overlap those of FIG. 2 are not described here. Further, the portions corresponding to those of FIG. 2 are denoted by the same reference numerals The portion surrounded by a two-dot chain line represents a semiconductor substrate Sub, and open circles on the two-dot chain lines represent external terminals. In FIG. 3, symbol Vss denotes ground potential such as zero volt or a terminal to which the ground potential is applied, Vee denotes a negative power source potential such as −5.2 V or a terminal to which the negative power source potential is applied, and Vsso denotes a Vss potential for the output buffer circuit or a terminal to which the Vss potential is applied.

In FIG. 3 are diagrammed the address buffer ADB, data input buffer DIB, block select control circuit BSCC, and a plurality of input latch circuits LT, LT, ....., LT that are included in the timing generating circuit TG. To the input latch circuits LT, LT, ..... are commonly supplied internal clock pulses $\overline{CP}$ that are generated by the timing generating circuit TG. In response to the internal clock pulses $\overline{CP}$ of the low level that are commonly input, the input latch circuits LT, ..... work to simultaneously latch the address signals A0 to Ai, write data DW0 to DWn, block select signals Bk0 to Bkl, and write enable signal WE that are input from the external units via the external terminals. Each of the latch circuits LT, ..... may be constituted using a bipolar ECL circuit shown, for example, in FIG. 5 to hold the address signals A0 to Ai of the ECL level, write data DW0 to DWn, block select signals Bk0 to Bkl, and write enable signal WE The latch circuit in FIG. 3 includes a bipolar transistor $T_{21}$ which receives the input signal IN of the ECL level through the base terminal thereof and a bipolar transistor $T_{22}$ which receives the reference potential $V_{bb1}$ through the base terminal thereof. The emitter terminals of these transistors $T_{21}$ and $T_{22}$ are commonly connected in a differential manner. Load resistors R8 and R9 are connected between the collector terminals of the transistors $T_{21}$, $T_{22}$ and the power source terminal Vss, respectively To the collector terminals of the transistors $T_{21}$ and $T_{22}$ are further connected the collector terminals of bipolar transistors $T_{24}$ and $T_{25}$, respectively, that are arranged in a differential manner. Further, collector terminals of bipolar transistors $T_{23}$ and $T_{26}$ arranged in a differential manner are connected to the common emitter terminal of the transistors $T_{21}$ and $T_{22}$ and to the common emitter terminal of the transistors $T_{24}$ and $T_{25}$, respectively. A current source CS1 is connected to the common emitter terminal of the transistors $T_{23}$ and $T_{26}$, and to the power source terminal Vee. A reference potential $V_{bb2}$ is supplied to the base of the transistor $T_{23}$ and the internal inverted clock pulse $\overline{CP}$ is supplied to the base of the transistor $T_{26}$. To the collector of the transistor $T_{21}$ is further connected a first emitter follower circuit that includes a bipolar transistor $T_{27}$ and a current source CS2 and a first emitter follower output circuit that includes a bipolar transistor $T_{29}$ and a load resistor $R10$. On the other hand, to the collector of the transistor $T_{22}$ connected a second emitter follower circuit that includes a bipolar transistor $T_{28}$ and a current source $CS3$ and a second emitter follower output circuit that includes a bipolar transistor $T_{30}$ and a load resistor $R11$. Outputs of the first and second emitter follower circuits are supplied to the base terminals of the transistors $T_{25}$ and $T_{24}$, respectively. That is, the potential at the collector terminal of the transistor $T_{21}$ is supplied to the base terminal of the transistor $T_{25}$ via transistor $T_{27}$, and the potential at the collector terminal of the transistor $T_{22}$ is supplied to the base terminal of the transistor $T_{24}$ via transistor $T_{28}$. The transistors $T_{29}$ and $T_{30}$ produce through the emitter terminals thereof an output signal $\overline{Out}$ of the ECL level inverted relative to the input signal IN and an output signal Out of the ECL level in phase with the input signal IN, respectively.

When the internal inverted clock pulse $\overline{CP}$ has a level higher than the level of the reference potential Vbb1, the transistor $T_{26}$ operates and the operation power source is supplied to the differential circuit consisting of the transistors $T_{24}$ and $T_{25}$. On the other hand, when the internal inverted clock pulse $\overline{CP}$ has the level lower than that of the reference potential Vbb1, the transistor $T_{23}$ operates and the operation power source is supplied to the differential circuit consisting of the transistors $T_{21}$ and $T_{22}$. Therefore, when the clock pulse $\overline{CP}$ has the low level, either one of the transistor $T_{21}$ or $T_{22}$ operates in response to the level of the input signal IN; i.e., the input signal IN is latched by the differential circuit consisting of the transistors $T_{21}$ and $T_{22}$. When the clock pulse $\overline{CP}$ has the high level, on the other hand, the data latched by the transistors $T_{21}$ and $T_{22}$ latched by the transistors $T_{24}$ and $T_{25}$.

Figure 5:
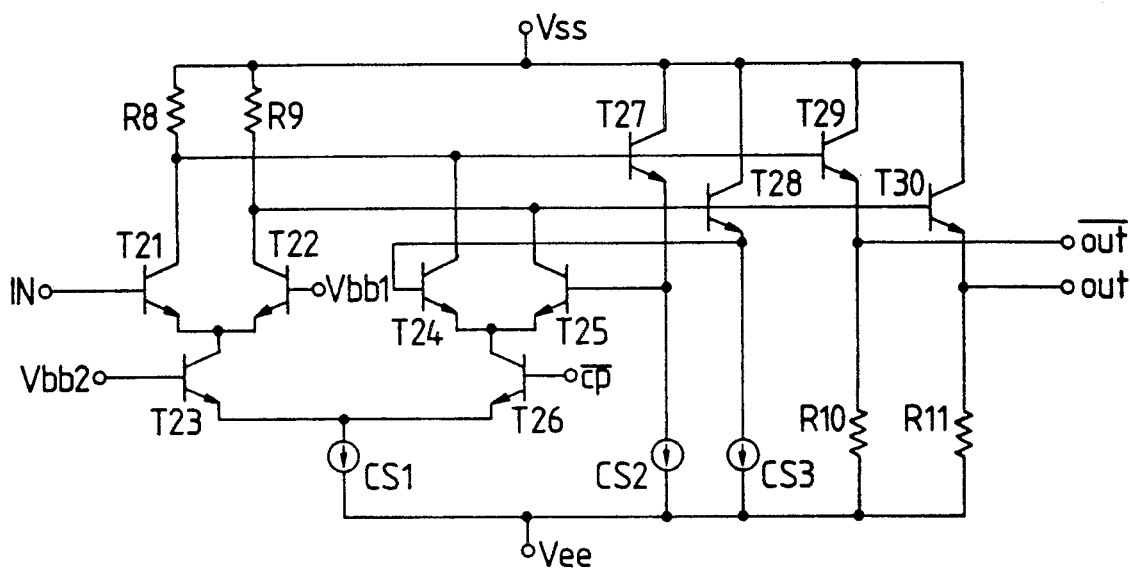
FIG. 5 is a diagram which concretely illustrates an input latch circuit LT that is shown in FIG. 3.

The latch circuit shown in FIG. 5 is constituted to produce a non-inverted output signal Out and an inverted output signal $\overline{Out}$. It can, however, be easily comprehended that an input latch circuit LT which produces a single output as shown in FIG. 3 is constituted by removing either the transistor $T_{29}$ and the resistor $R10$ or the transistor $T_{30}$ and the resistor $R11$.

The address buffer ADB shown in FIG. 3 further includes buffer circuits BC, ..... for forming non-inverted and inverted internal address signals a0, $\overline{a0}$, ....., ai, $\overline{ai}$ upon receiving output signals A0 to Ai from the corresponding latch circuits LT, ...... Each of the buffer circuits BC, ..... should be constituted by a general ECL circuit from the standpoint of increasing the operation speed.

The address decoder AD receives the non-inverted and inverted internal address signals a0, $\overline{a0}$, ....., ai, $\overline{ai}$ supplied from the address buffer ADB and decodes them in order to form select signals for selecting one or more memory cells according to address signals input from some of the plurality of memory cells. Fundamentally, the address decoder AD includes a decoder unit DEC formed by the ECL circuit and the wired OR logic, a level conversion unit LEC constituted by a bipolar CMOS circuit, and a driver unit DR constituted by the CMOS circuit or the bipolar CMOS circuit. The decoder unit DEC decodes, maintaining the ECL level, the internal address signal of the ECL level supplied from the address buffer ADB. The decoded internal signal of the ECL level is then converted from the ECL level into the CMOS level through the level conversion unit LEC. The signal converted into the CMOS level is supplied to the driver unit DR. Since the decoder unit is constituted by a high-speed ECL circuit, the decoding time of the address decoder AD is shortened.

The memory array is divided into a plurality of memory mats MAT0, MAT1, MAT2, ....., MATn each having the same structure. FIG. 3 exemplifies the constitution of the memory mat MAT0.

The memory mat MAT0 includes a plurality of memory cells MC, word lines W1 to Wn connected to the memory cells, and complementary data line pairs D0, $\overline{D0}$, ....., Dn, $\overline{Dn}$. One memory cell MC is connected to one word line and to a pair of complementary data lines. The memory mat MAT0 further includes a common data line pair CDL0, $\overline{CDL0}$ as well as select MOS-FET's Ys0, $\overline{Ys0}$, ....., Ysn, $\overline{Ysn}$ whose source-drain paths are connected between the common data line pair CDL0, $\overline{CDL0}$ and the complementary data line pairs D0, $\overline{D0}$, ....., Dn, $\overline{Dn}$. As shown in FIG. 3, gate electrodes of the select MOSFET's Ys0, $\overline{Ys0}$ (Ysn, $\overline{Ysn}$) coupled to the complementary data line pairs $\overline{D0}$, D0 (Dn, $\overline{Dn}$) are commonly connected and are coupled to the output terminals of the address decoder AD. The address decoder AD supplies select signals $Y_l$, ....., $Y_n$ that alternatively assume the select condition according to the address signals, to the gate electrodes of the corresponding select MOSFET's Ys0, $\overline{Ys0}$, ....., Ysn, $\overline{Ysn}$. Therefore, a memory cell in the memory Ysn, $\overline{Ysn}$. Therefore, a memory cell in the memory mat MAT0 is selected by selecting one word line and one pair of select MOSFET's using the address decoder AD.

Though there is no particular limitation, the memory cells constituting the memory mat MAT0 are the static ones. That is, as diagramed in FIG. 3, the input and output nodes of the memory cell are connected to the corresponding complementary data line pair D0, $\overline{D0}$ via source-drain paths of n-channel transfer gate MOS-FET's $t_{r1}$ and $t_{r2}$. The gate electrodes of the transfer gate MOSFET's $t_{r1}$ and $t_{r2}$ are connected to the word line W1. The memory cell further includes a pair of n-channel drive MOSFET's $d_1$ and $d_2$ with their drains and gates being connected in a crossing manner and with their sources being connected to the electrode terminal Vee, and load resistors RL1 and RL2 that are connected between the drains of the drive MOSFET's $d_1$, $d_2$ and the power source terminal Vss, respectively. The load resistors RL1 and RL2 may be composed of polycrystalline silicon having high resistivity. The load resistors RL1 and RL2 may further be constituted by a pair of p-channel MOSFET's. In this case, the gate electrodes of the p-channel MOSFET's constituting the load resistances RL1 (RL2) and of the drive MOSFET's dr1 (dr2) are commonly connected to form a CMOS inverter.

The data input buffer DIB includes input latch circuits LT, ..... of a number of n+1 and buffer gates BG of a number of n+1 that receive output signals of the ECL level produced from the input latch circuits LT, ..... of the number of n+1. Each of the buffer gates BG may be constituted by the ECL circuit or the bipolar CMOS circuit. When the buffer gate BG is constituted by the ECL circuit, either the data input buffer DIB or the write amplifier WA must include an ECL-CMOS level conversion circuit constituted by the Bi-CMOS circuit.

The buffer gates BG form complementary internal write signals dw0 to dwn upon receiving signals produced from the input latch circuits LT, ....., and send them to the write amplifier WA that will be described later. The complementary internal write signals dw0 to dwn are diagrammed as non-inverted and inverted internal write signals $dw0, \ldots, dwn, \overline{dwn}$.

The write amplifier W includes n+1 write amplifier circuits WA0 to WAn that receive non-inverted and inverted internal write signals $dw0, \overline{dw0}$, to $dwn, \overline{dwn}$ supplied from the corresponding buffer gates BG in the data input buffer DIB. The output terminals of the write amplifier circuits WA0 to WAn are connected to the common data line pair (CDL0, $\overline{CDL0}$) provided in each of the memory mats MAT0 to MATn. The write amplifier circuits WA0 to WAn commonly receive a write pulse of the CMOS level supplied from the timing generating circuit TG, and operates in response to the write pulse $\overline{\phi w}$ of the low level. The write amplifier circuits WA0 to WAn are constituted by the CMOS circuits, and change the levels of the common data line pair (CDL0, $\overline{CDL0}$) into the CMOS high level and low level, or into the CMOS low level and high level, so as to be corresponded to the levels of the non-inverted and inverted internal write signals $dw0, \overline{dw0}$ to $dwn, \overline{dwn}$ that are input. When the data is to be written onto a memory cell connected to the word line 1 and to the data line pair D0, $\overline{D0}$ in the memory mat MAT0, the address decoder AD renders the word line W1 to assume the select level and generates a select signal Y1 of the select level, such that the select MOSFET's Ys0, $\overline{Ys0}$ are rendered conductive. Therefore, potentials of the common data line pair CDL0, $\overline{CDL0}$ changed by the write amplifier WA0 are transmitted to the complementary data line pair D0, $\overline{D0}$. On the other hand, since the transfer MOSFET's $t_{r1}$ and $t_{r2}$ in the memory cell MC have been rendered conductive, the potentials on the complementary data line pair D0, $\overline{D0}$ are transferred to the memory nodes of the memory cell MC. Therefore, the conductive and nonconductive conditions of the drive MOSFET's $d_1$, $d_2$ or the nonconductive and conductive conditions thereof are determined, and the data is written onto the memory cell MC.

The read amplifier RA includes read amplifier circuits RA0 to RAn that correspond to each of the memory mats MAT0 to MATn. FIG. 3 illustrates the read amplifier circuit RA0 in detail. Other read amplifier circuits RA1, ....., RA0 are constituted in the same manner.

The read amplifier circuit RA0 includes differential bipolar transistors $db_1$ and $db_2$ of which the emitters are commonly connected, and a MOSFET$_{CSM}$ for supplying current of which the source-drain path is connected between the common emitters of the above differential bipolar transistors and the power source terminal Vee. The read amplifier RA0 further includes a level shifting bipolar transistor LSB1 and a level shifting diode D1 that are provided between the base of the transistor $db_1$ and the common data line CDL0, as well as a level shifting bipolar transistor LSB2 and a level shifting diode D2 provided between the base of the transistor $db_2$ and the common data line $\overline{CDL0}$. In order to control the MOSFET CSM, provision is made of a switching MOSFET SW of which the source-drain path is connected between the gate of the MOSFET CSM and the voltage source VIE. The MOSFET SW is served through the gate thereof with a timing signal (select signal) $\phi_{r0}$ supplied from the read amplifier select circuit RASC. The differential bipolar transistors $db_1$ and $db_2$ are regarded to form a sense amplifier, and their collectors are connected to a data output intermediate amplifier DOIA 0 which amplifies complementary output signals $c, \overline{c}$ from the sense amplifier and supplies them to the data output buffer DOB. When the data are to be read out from the memory mat MAT0, the timing signal $\phi_{r0}$ assumes the high level and the MOSFET SW is turned on. Therefore, the potential of the voltage source VIE is supplied to the gate of the MOSFET CSM to render it conductive. The operation current therefore is supplied to the differential bipolar transistors $db_1$ and $db_2$. Depending upon the conditions, the differential bipolar transistors $db_1$ and $db_2$ receive through the base terminals thereof the potentials on the common data line pair CDL0 and $\overline{CDL0}$ of which the levels are shifted. Depending upon the data to be read out, potentials of the common data line pair CDL0 and $\overline{CDL0}$ assume the high level and low level, or the low level and high level, whereby the differential transistor that receives the high-level potential through the base is rendered conductive and another differential transistor is rendered nonconductive. The data output intermediate amplifier DOIA 0 amplifies the collector outputs of the differential transistors $db_1$ and $db_2$, and forms complementary internal read signals $dr0, \overline{dr0}$. The complementary internal read signals $dr0, \overline{dr0}$ are supplied to the data output buffer DOB. When the data output buffer DOB is in operation, the complementary internal read signals $dr0, \overline{dr0}$ are sent out of the chip as read data DR0.

Figure 9:
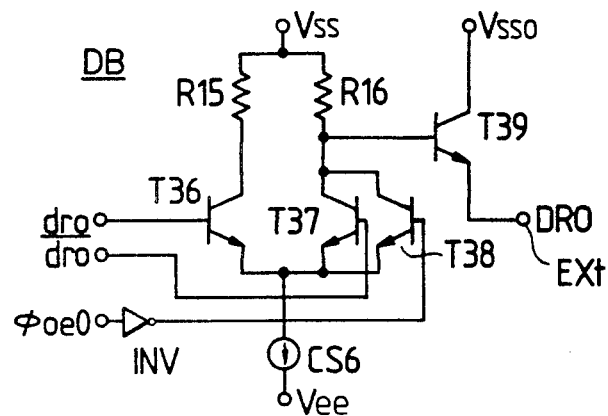
FIG. 9 is a diagram which concretely illustrates an output buffer circuit DB that is shown in FIG. 3.

The data output buffer DOB includes output buffer circuits DB, ..... for receiving complementary internal read signals $dr0, \overline{dr0}$ to $drn, \overline{drn}$ that are produced from the read amplifier circuits RA0 to RAn. The output buffer circuits DB, ..... are controlled for their operation by the timing signals $\phi_{oe0}$ to $\phi_{oen}$. Each of the output buffer circuits DB may have the circuit constitution that is shown in FIG. 9. That is, the output buffer circuit DB includes bipolar transistors $T_{36}$ and $T_{37}$ of a differential form that receive the complementary internal read signals $dr0, \overline{dr0}$ through the bases thereof, a bipolar transistor $T_{38}$ having an emitter-collector path connected in parallel with the emitter-collector path of the transistor $T_{37}$, load resistors R15 and R16 provided between the collectors of the transistors $T_{26}$, $T_{27}$ and the power source terminal Vss, and a current source CS6 connected between the common emitters of the transistors $T_{36}$, $T_{37}$ and the power source terminal Vee. The transistor $T_{38}$ receives through the base thereof the timing signal $\phi_{oe0}$ via an inverter circuit INV. The output buffer circuit DB further includes an output bipolar transistor $T_{39}$. The base of the output transistor $T_{39}$ is connected to a point where the load resistor R16 and the collector of the transistor $T_{37}$ are connected together. Furthermore, the collector of the output transistor $T_{39}$ is connected to the power source terminal Vss0 and the emitter thereof is connected to an external output terminal Ext. That is, the above output transistor is an open-emitter output transistor.

As the timing signal $\phi_{oe0}$ assumes the low level, the control transistor $T_{38}$ is rendered conductive. Therefore, the base potential of the output transistor $T_{39}$ drops; i.e., the output transistor $T_{39}$ is rendered nonconductive. Therefore, the emitter potential of the output transistor $T_{39}$ assumes a value close to ground potential Vee of the circuit due to a pull-down resistor (not shown) provided on the external side.. As the timing signal $\phi_{oe0}$ assumes the high level, on the other hand, the control transistor $T_{38}$ is rendered nonconductive. At this moment, operation conditions of the transistors $T_{36}$ and $T_{37}$ are determined in response to the high level and low level, or the low level and high level of the internal read signals dw0 and $\overline{dw0}$ supplied from the read amplifier circuit RA0. The potential at the external terminal Ext assumes the high or low ECL level in response to the high level and low level, or the low level and the high level of the internal read signals dw0 and $\overline{dw0}$. The read data DR0 is thus read out.

The block select control circuit BSCC includes input latch circuits LT of a number of k+1 and a logic circuit LOGIC CKT served with output signals bk0 to bkl from the latch circuits LT. The logic circuit LOGIC CKT produces timing signals $\phi_{oe0}$ to $\phi_{oen}$ upon receipt of a predetermined internal address signals ax supplied from the address buffer circuit ADB. In response to the internal block select signals bk0 to bkl latched by the input latch circuits and the internal address signal ax, the logic circuit LOGIC CKT discriminates the output buffer circuit DB that should be operated simultaneously, and sends timing signals that should temporarily assume the high level to the buffer circuit DB that should be operated. The timing signals $\phi_{oe0}$ to $\phi_{oen}$ are regarded to be output buffer circuit select signals. The block select control circuit BSCC is provided for fine control of the number of bits of the read data that is to be produced. Therefore, the semiconductor memory finds general applicability more extensively.

Upon receipt of a predetermined internal address signal ay among the internal address signals a0, $\overline{a0}$, ....., an $\overline{an}$ produced from the address buffer ADB, the read amplifier select circuit RASC produces control signals $\phi_{r0}$ to $\phi_{rn}$ to activate the read amplifier circuits RA0 to RAn connected to the memory mats MAT0 to MATn from which are to be read out the data stored in the memory cells.

Figure 4:
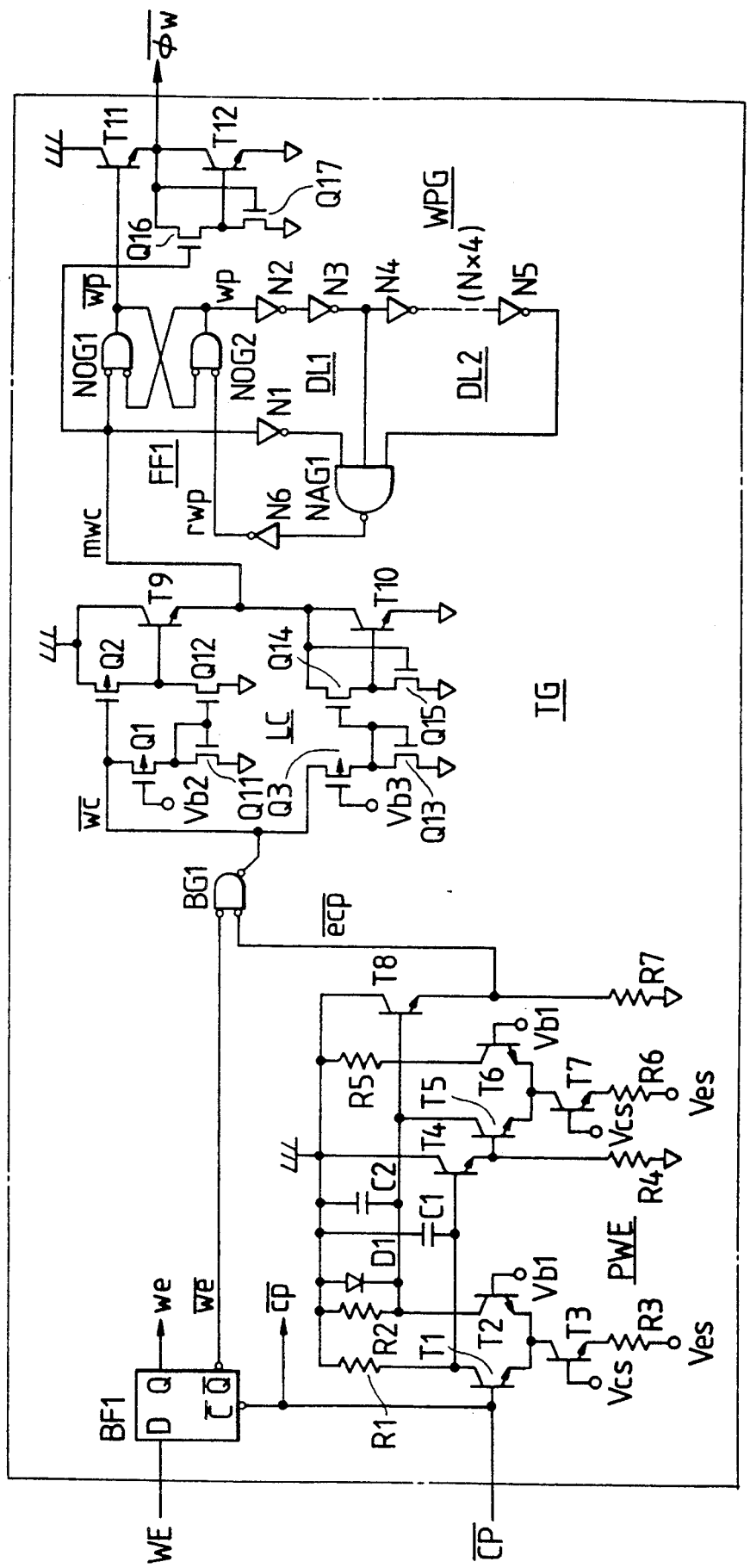
FIG. 4 is a diagram showing an embodiment of the timing generating circuit of the memory with logic functions to which the present invention is adapted.

The timing generating circuit TG includes a latch circuit LT for latching the write enable signal WE supplied from an external unit and a write pulse generating unit WPG UNIT for generating an internal write pulse $\overline{\phi w}$ upon receipt of the inverted internal write enable signal $\overline{we}$ sent from the latch circuit LT. FIG. 4 illustrates the write pulse generating unit WPG UNIT in further detail.

FIG. 4 is a circuit diagram which illustrates in detail the timing generating circuit TG of the memory with logic functions shown in FIG. 2 or 3. FIG. 4 partly illustrates an input latch for receiving the write enable signal WE, a pulse width expander circuit PWE, a level conversion circuit LC and a write pulse generating circuit WPG that are included in the timing generating circuit TG. Other circuits in the timing generating circuit TG have no direct relation to the present invention and are not described here. In FIG. 4, the MOSFET's with arrows at the channel (back gate) portions are the p-channel ones which are distinguished from the n-channel MOSFET's without arrows. Further, the bipolar transistors that are diagramed are all npn-type transistors. The flip-flop BF1 that will be described later corresponds to the latch circuit LT in the timing generating circuit TG shown in FIG. 3. Further, the pulse width expander circuit PWE, level conversion circuit LC and write pulse generating circuit WPG are included in the write pulse generating unit WPG UNIT shown in FIG. 3.

In FIG. 4, the write enable signal WE supplied to the memory with logic function is input to the input terminal D of the flip-flop circuit BF1. Though there is no particular limitation, the flip-flop circuit BF1 can be constituted by an ECL series gate consisting of bipolar transistors shown in FIG. 5. The inverted clock input terminal $\overline{C}$ of the flip-flop circuit BF1 is served with an inverted clock signal $\overline{CP}$ supplied from an external unit. The inverted clock signal $\overline{CP}$ usually has the high ECL level and periodically assumes the low level maintaining a predetermined time interval. The non-inverted output signal Q of the flip-flop circuit BF1 is supplied as an internal control signal we to other pulse generating circuit (now shown) in the timing generating circuit TG. The inverted output signal of the flip-flop circuit BF1 serves as an inverted internal control signal $\overline{we}$ and is supplied to one input terminal of a NOR gate circuit BG1. The NOR gate circuit BG1 may be constituted by an ECL gate circuit that is shown in FIG. 6.

Figure 6:
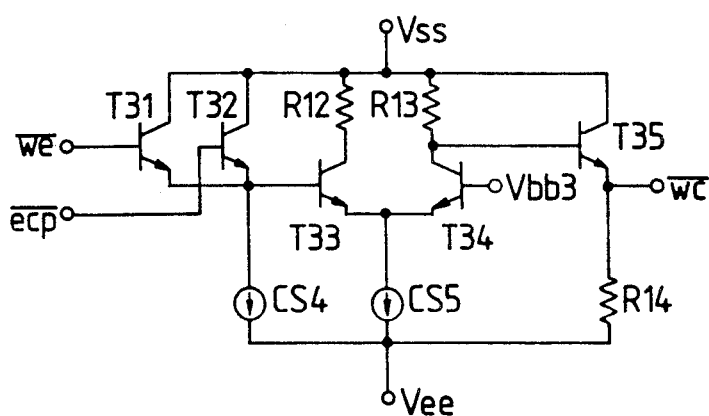
FIG. 6 is a diagram which concretely illustrates a bipolar NOR gate BG1 that is shown in FIG. 4.

That is, referring to FIG. 6, the NOR gate circuit BG1 includes a bipolar transistor $T_{31}$ that receives the inverted internal control signal $\overline{we}$ through the base thereof, a bipolar transistor $T_{32}$ that receives the inverted internal clock signal $\overline{ecp}$ through the base thereof, a bipolar transistor $T_{33}$ having a base connected to the emitters of the transistors $T_{31}$ and $T_{32}$, a bipolar transistor $T_{34}$ which is connected to the transistor $T_{33}$ in a differential manner and which is served with a reference potential $Vbb_3$ through the base thereof, a current source CS4 provided between the transistor $T_{33}$ and the power source terminal Vee, a current source CS5 provided between the common emitters of the differential transistors $T_{33}$, $T_{34}$ and the power source terminal Vee, resistor means R12 and R13 provided between the collectors of the differential transistors $T_{33}$, $T_{34}$ and the power source terminal Vss, and an emitter follower output circuit that consists of an output bipolar transistor $T_{35}$ and a resistor means R14. As will be easily understood from FIG. 6, the output signal $\overline{wc}$ assumes the low level only during the period in which both the inverted internal control signal $\overline{we}$ and the inverted internal clock signal $\overline{ecp}$ assume the low level.

The input operation of the memory with logic functions of this embodiment is synchronized according to the inverted clock signals $\overline{CP}$ as described earlier. Further, the operation mode of the memory with logic functions is the read operation mode when the write enable signal WE has the low level and is the write operation mode when the write enable signal WE has the high level. At the breaking edge of the inverted clock signal $\overline{CP}$, the write enable signal WE is received by the flip-flop circuit BF1. As a result, the internal control signal we and the inverted internal control signal $\overline{we}$ selectively assume the high level or the low level, and the operation mode of the memory with logic functions is determined in this cycle.

The inverted clock signal $\overline{CP}$ is supplied as the inverted internal clock signal $\overline{cp}$ substantially in phase therewith to the base of the transistor T1 that constitutes the pulse width expander circuit PWE, and is further supplied to other circuits in the timing generating circuit TG and to the input latch circuits LT, ....., LT shown in FIG. 3.

The pulse width expander circuit PWE includes a transistor T2 arranged in a differential manner relative to the transistor T1. Emitters of the transistors T1 and T2 are commonly connected together and are further connected to a predetermined power source voltage Ves via a transistor T3 and a resistor R3. The transistor T3 and the resistor R3 work as a constant-current source for supplying an operation current to the differential transistors T1 and T2. Collectors of the transistors T1 and T2 are connected to ground potential of the circuit via the corresponding resistors R1 and R2, respectively. The transistor T2 is served through the base thereof with a predetermined bias voltage Vb1.

In response to the inverted clock signal $\overline{CP}$, therefore, the differential transistors T1 and T2 work as a current switching circuit with the above bias voltage Vb1 as a logic threshold voltage. That is, when the inverted clock signal $\overline{CP}$ has the high ECL level greater than the bias voltage Vb1, the transistor T1 is rendered conductive and the transistor T2 nonconductive. In this case, the collector voltage of the transistor T1 assumes a predetermined low ECL level determined by the operation current supplied through the transistor T3 and the resistor R1. Further, the collector voltage of the transistor T2 assumes the high ECL level such as ground potential of the circuit. On the other hand, as the inverted clock signal $\overline{CP}$ assumes the low ECL level smaller than the bias voltage Vb1, the transistor T1 is rendered nonconductive and, instead, the transistor T2 is rendered conductive. In this case, the collector voltage of the transistor T1 assumes the high ECL level such as ground potential of the circuit, and the collector voltage of the transistor T2 assumes a predetermined low ECL level determined by the operation current supplied through the transistor T3 and the resistor R2.

Though there is no particular limitation, a capacitor C1 is provided in parallel with the resistor R1 between the collector of the transistor T1 and ground potential of the circuit. Further, a capacitor C2 is provided in parallel with the resistor R2 between the collector of the transistor T2 and ground potential of the circuit. Though there is no particular limitation, a diode D1 is connected in parallel with the resistor R2 with its anode being coupled to ground potential of the circuit. Among them, the capacitor C2 is discharged relatively slowly as the transistor T2 is rendered conductive to determine a delay time tb of the pulse width expander circuit PWE for the inverted clock signal $\overline{CP}$ as will be described later. The capacitor C1 is discharged relatively slowly as the transistor T1 is rendered conductive to determine a pulse width tw2 of the output signal, i.e., inverted internal clock signal $\overline{ecp}$ of the pulse width expander circuit PWE. The diode D1 works to clamp the collector voltage so that it will not drop excessively when the transistor T2 is rendered conductive.

The collector voltage of the transistor T1 is supplied to the base of the transistor T5 via the emitter follower circuit consisting of a transistor T4 and a resistor R4. A transistor T5 is connected in a differential manner relative to a transistor T6. A constant-current source consisting of a transistor T7 and a resistor R6 is provided between the common emitters of the transistors T5, T6 and power source voltage Ves of the circuit. The collector of the transistor T5 is connected to the collector of the transistor T2, and the collector of the transistor T6 is connected to ground potential of the circuit via the resistor R5. The transistor T6 is served through the base thereof with the bias voltage Vb1.

Therefore, the differential transistors T5 and T6 work as a current switching circuit for an internal signal that is lower than the emitter voltage of the transistor T4, i.e., lower than the collector voltage of the transistor T1 by the base-emitter voltage of the transistor T4, using the bias voltage Vb1 as a logic threshold. With the collector being connected to the collector of the transistor T2, furthermore, the transistor T5 forms a NOR gate circuit together with the transistor T2. The collector voltage of the transistors T2 and T5 is produced via an emitter follower circuit consisting of a transistor T8 and a resistor R7, and serves as an output signal, i.e., serves as an inverted internal clock signal $\overline{ecp}$ of the pulse expander circuit PWE. The inverted internal clock signal $\overline{ecp}$ is supplied to another input terminal of the NOR gate circuit BG1.

The pulse width expander circuit PWE forms an inverted internal clock signal $\overline{ecp}$ that has a predetermined delay time tb relative to the break of the inverted clock signal $\overline{CP}$ and that has a pulse width tw2 greater than the pulse width tw1 of the inverted clock signal $\overline{CP}$. That is, when the inverted clock signal $\overline{CP}$ has the high level, the transistor T1 is rendered conductive and the transistor T2 nonconductive. In this case, the collector voltage of the transistor T1 has the low ECL level. Further, the collector voltage of the transistor T2 has the high ECL level such as ground potential of the circuit and the capacitor C2 is discharged.

As the inverted circuit signal $\overline{CP}$ changes from the high level to the low level, the transistor T1 is rendered nonconductive and, instead, the transistor T2 is rendered conductive. Therefore, the collector voltage of the transistor T2 tends to change to a predetermined low level. However, since the operation current that flows via the transistor T2, first, works to electrically charge the capacitor C2, the level gradually changes into the low level. Therefore, the inverted internal clock signal $\overline{ecp}$ assumes the low level being lagged behind the break of the inverted clock signal $\overline{CP}$ by a predetermined delay time tb determined by the electrostatic capacity of the capacitor C2. As the transistor T1 is rendered nonconductive, the collector voltage assumes the high level such as ground potential of the circuit and the transistor T5 is rendered conductive. As the collector voltage of the transistor T1 assumes the high level, the capacitor C1 is discharged.

Next, as the inverted clock signal $\overline{CP}$ assumes the high level again, the transistor T1 is rendered conductive and the transistor T2 nonconductive. Therefore, the collector voltage of the transistor T1 tends to change into the low level. However, since the operation current that flows via the transistor T1, first, works to electrically charge the capacitor C1, the level changes gradually into the low level. During this period, therefore, the transistor T5 remains conductive and the inverted internal clock signal $\overline{ecp}$ assumes the high level being lagged behind the rise of the inverted clock signal $\overline{CP}$ by a predetermined delay time tw2 determined by the electrostatic capacity of the capacitor C1. It needs not be pointed out that the delay time tw2 determines the pulse width of the inverted internal clock signal $\overline{ecp}$.

The inverted output signal of the NOR gate circuit BG1 is supplied as an inverted internal signal $\overline{wc}$ (second internal signal) to the gate of a p-channel MOSFET Q2 that constitutes a level conversion circuit LC, and is further supplied to the sources of p-channel MOSFET's Q1 and Q3. The inverted internal signal $\overline{wc}$ usually has the high level and is selectively rendered to assume the low level when both the inverted internal control signal $\overline{we}$ and the inverted internal clock signal $\overline{ecp}$ assume the low level.

The level conversion circuit LC includes two bipolar transistors T9 and T10 that are provided in the form of a totem pole between ground potential of the circuit and the power source voltage. The MOSFET Q2 is provided between the base of the transistor T9 and ground potential of the circuit, and an n-channel MOSFET Q12 is provided between the base of the transistor T9 and the power source voltage of the circuit. The gate of the MOSFET Q12 is connected to the gate of an n-channel MOSFET Q11 and is further connected to the drain thereof. The source of the MOSFET Q11 is connected to the power source voltage of the circuit. Further, the MOSFET Q1 is provided between the drain of the MOSFET Q11 and the gate of the MOSFET Q2. Though there is no particular limitation, the MOSFET Q1 is served through the gate thereof with a predetermined bias voltage Vb2. Therefore, the MOSFET's Q1 and Q11 so work that the MOSFET Q12 will possess a predetermined logic threshold determined by the bias voltage Vb2 for the inverted internal signal $\overline{we}$.

An n-channel MOSFET Q14 is provided between the base and the collector of the transistor T10. Further, an n-channel MOSFET Q15 is provided between the base of the transistor T10 and the power source voltage of the circuit. The gate of the MOSFET Q15 is connected to the collector of the transistor T10. An n-channel MOSFET Q13 is provided between the gate of the MOSFET Q14 and the power source voltage of the circuit. With the gate being connected to the drain, the MOSFET Q13 works as a diode. The MOSFET Q3 is provided between the drain of the MOSFET Q13 and the gate of the MOSFET Q2. The MOSFET Q3 is served through the gate thereof with a predetermined bias voltage Vb3. Therefore, the MOSFET's Q3 and Q13 so work that the MOSFET Q14 will have a predetermined logic threshold determined by the bias voltage Vb3 for the inverted internal signal $\overline{wc}$.

The level at a node where the emitter of the transistor T9 and the collector of the transistor T10 are connected together serves as an output signal, i.e., an internal signal mwc of the level conversion circuit LC, and is supplied to the write pulse generating circuit WPG of the timing generating circuit TG.

When the inverted internal signal $\overline{wc}$ has a predetermined high level, the MOSFET's Q12 and Q14 are both rendered conductive and the MOSFET Q2 nonconductive. Therefore, the transistor T9 is rendered nonconductive since the base current thereof is interrupted and the base capacity is discharged, and the transistor T10 is rendered conductive since the base current thereof continues to flow via MOSFET Q14 until the collector potential drops sufficiently. Accordingly, the output signal, i.e., internal signal mwc of the level conversion circuit LC assumes the low CMOS level which is nearly equal to power source voltage of the circuit. On the other hand, as the inverted internal signal $\overline{wc}$ assumes a predetermined low level, the MOSFET's Q12 and Q14 are rendered nonconductive and, instead, the MOSFET Q2 is rendered conductive. Therefore, the transistor T9 is rendered conductive and the transistor T10 nonconductive. Therefore, the output signal, i.e., internal signal mwc of the level conversion circuit LC assumes the high CMOS level that is lower than the ground potential of the circuit by the base-emitter voltage of the transistor T9.

Figure 7:
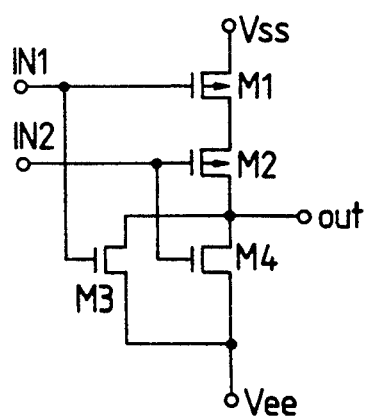
FIG. 7 is a diagram which concretely illustrates NOR gates NOG1 and NOG2 shown in FIG. 4.

Though there is no particular limitation, the write pulse generating circuit WPG consists fundamentally of a flip-flop circuit FF1 in which NOR gate circuits NOG1 and NOG2 are connected to each other in a crossing manner. The circuit elements in the write pulse generating circuit WPG including the NOR gate circuits NOG1 and NOG2 are mostly constituted by the CMOS. As shown in FIG. 7, for example, each of the NOR gate circuits NOG1 and NOG2 can be constituted by p-channel MOSFET's M1 and M2 whose source-drain paths are connected in series between the power source terminal Vss and the output terminal Out, and n-channel MOSFET's M3 and M4 whose source-drain paths are connected in parallel between the output terminal Out and the power source terminal Vee. Gate electrodes of the MOSFET's M1 and M2 are connected to gate electrodes of the MOSFET's M3 and M4, respectively, to constitute input terminals IN1 and IN2.

One input terminal of the NOR gate circuit NOG1 serves as a set input terminal of the flip-flop circuit FF1 and is served with an internal signal mwc from the level conversion circuit LC. One input terminal of the NOR gate circuit NOG2 serves as a reset input terminal of the flip-flop circuit FF1 and is served with an output signal, i.e., reset signal rwp of the inverter circuit N6. The output signal of the NOR gate circuit NOG1 serves as an inverted output signal, i.e., inverted internal signal $\overline{wp}$ of the flip-flop circuit FF1, and is supplied to the base of the output transistor T11. Further, the output signal of the NOR gate circuit NOG2 is supplied to the input terminal of the inverter circuit N2 as a non-inverted output signal, i.e., as an internal signal wp of the flip-flop circuit FF1. The inverter circuit N2 is connected in series with the inverter circuit N3 to constitute a delay circuit DL1. The output signal of the inverter circuit N3 is supplied to a second input terminal of the NAND gate circuit NAG1, and is supplied to a third input terminal of the NAND gate circuit NAG1 through a delay circuit DL2 consisting of four inverter circuits N4 to N5. The first input terminal of the NAND gate circuit NAG1 is served with an inverted signal obtained from the internal signal mwc through the inverter circuit N1. The output signal of the NAND gate circuit NAG1 serves as the reset signal rwp through the inverter circuit N6. Here, the NAND gate circuit may be a generally used CMOS NAND gate circuit.

When the internal signal mwc has the low CMOS level, the output signal of the inverter circuit N1 assumes the high level. Therefore, when the flip-flop circuit FF1 is set and the internal signal wp has the high level just before the above-mentioned moment, the reset signal rwp assumes the high level and the flip-flop circuit FF1 is reset.

As the internal signal mwc assumes the high CMOS level, the output signal of the inverter circuit N1 assumes the low level and whereby the reset signal rwp is forcibly rendered to assume the low level. Therefore, it appears as if there exists a ring oscillator since there equivalently exist inverter circuits of an even number of stages in the path between the internal signal wp output terminal and the reset terminal of the flip-flop circuit FF1. However, oscillation of the ring oscillator is prevented by the inverter N1. As the internal signal mwc assumes the high level, furthermore, the inverted output signal, i.e., inverted internal signal $\overline{wp}$ of the flip-flop circuit FF1 assumes the low level. Therefore, the non-inverted output signal, i.e., internal signal wp of the flip-flop circuit FF1 assumes the high level, and the flip-flop circuit FF1 assumes the so-called set condition. Even after the internal signal mwc is returned back to the low level, the flip-flop circuit FF1 maintains the set condition until the reset signal rwp assumes the high level.

Figure 8:
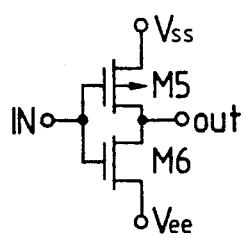
FIG. 8 is a diagram which concretely illustrates inverters N1 to N6 that are shown in FIG. 4.

The internal signal wp of the high level is transmitted to the second and third input terminals of the NAND gate circuit NAG1 via delay circuits DL1 and DL2. In this case, the internal signal mwc assumes the low level and the output signal of the inverter circuit N1 assumes the high level, so that the reset signal rwp assumes the high level. Therefore, the flip-flop circuit FF1 is reset, and the inverted internal signal $\overline{wp}$ assumes the high level and the internal signal wp assumes the low level. Accordingly, the output signal, i.e., the inverted internal signal $\overline{wp}$ of the flip-flop circuit FF1 breaks as the output signal, i.e., internal signal mwc of the level conversion circuit LC assumes the high level, and serves as a negative pulse having a pulse width corresponding to delay times of the delay circuits DL1 and DL2. The above-mentioned inverter circuits N1 to N5 can be each constituted by a CMOS inverter circuit that includes a p-channel MOSFET M5 and an n-channel MOSFET M6 as shown in FIG. 8.

Though there is no particular limitation, the write pulse generating circuit WPG includes a bipolar CMOS composite drive circuit which consists fundamentally of bipolar transistors T11 and T12 in the form of a totem pole. The collector of the transistor H is connected to ground potential of the circuit, and the base thereof is served with the inverted internal signal $\overline{wp}$. The emitter of the transistor T12 is connected to power source voltage of the circuit Further, an n-channel MOSFET Q16 is provided between the base and the collector of the transistor T12, and an n-channel MOSFET Q17 is provided between the base thereof and power source voltage of the circuit. Though there is no particular limitation, the MOSFET Q16 is served through the gate thereof with an output signal, i.e., an internal signal mwc of the level conversion circuit LC. Further, the gate of the MOSFET Q17 is connected to the collector of the transistor T12. The level at the node where the emitter of the transistor T11 and the collector of the transistor T12 are connected together serves as an output signal, i.e., serves as the inverted timing signal $\overline{\phi w}$ of the write pulse generating circuit WPG.

When the internal signal mwc assumes the low level and the inverted internal signal $\overline{wp}$ assumes the high level, the transistor T11 is rendered conductive and the transistor T12 is rendered nonconductive since the MOSFET Q16 is turned off and no current flows into the base thereof. Therefore, the inverted timing signal $\overline{\phi w}$ assumes the high CMOS level that is lower than ground potential of the circuit by the base-emitter voltage of the transistor T11. When the internal signal mwc assumes the high level and the inverted internal signal $\overline{wp}$ assumes the low level, the transistor T11 is rendered nonconductive and, instead, the transistor T12 is rendered conductive. Therefore, the inverted timing signal $\overline{\phi w}$ assumes the low CMOS level such as the power source voltage of the circuit. The bipolar CMOS composite drive circuit helps increase the driving ability of the inverted timing signal $\overline{\phi w}$ that is produced from the write pulse generating circuit WPG.

Figure 10:
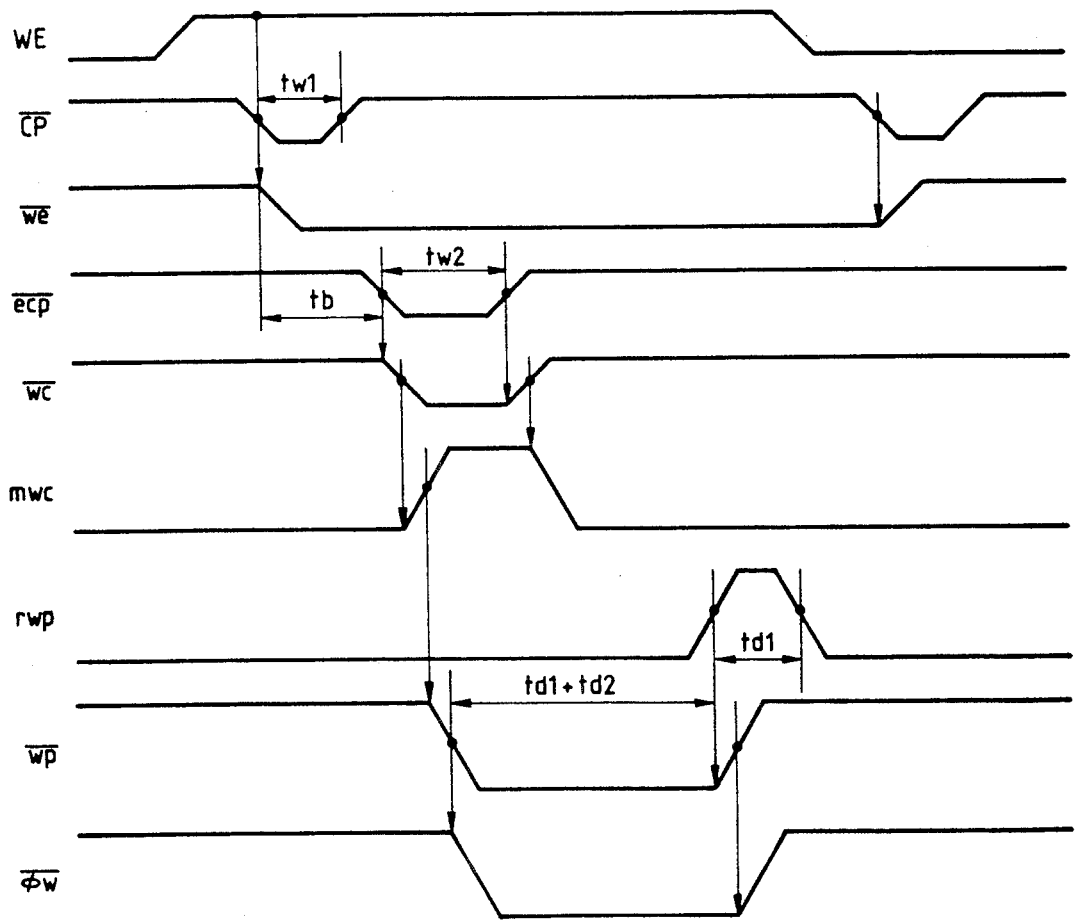
FIG. 10 is a diagram showing the timings of the timing generating circuit of FIG. 4.

FIG. 10 is a diagram of timings of the timing generating circuit TG of FIG. 4 according to this embodiment. Operation of the timing generating circuit TG will now be briefly described with reference to FIG. 10.

In FIG. 10, the memory with logic functions assumes the write operation mode as the write enable signal WE assumes the high level before the inverted clock signal $\overline{CP}$ breaks.

In the timing generating circuit TG, the flip-flop circuit BF1 is set since the write enable signal WE assumes the high level at the breaking edge of the inverted clock signal $\overline{CP}$, and the inverted output signal $\overline{Q}$ assumes the low level, i.e., the inverted internal control signal $\overline{we}$ assumes the low level. Through the NOR gate circuit BG1, the inverted internal control signal $\overline{we}$ is subjected to the AND operation of negative logic together with the output signal, i.e., together with the inverted internal clock signal $\overline{ecp}$ of the pulse width expander circuit PWE, thereby to form an inverted internal signal $\overline{wc}$. As described earlier, the inverted internal clock signal $\overline{ecp}$ is delayed behind the inverted clock signal $\overline{CP}$ by a predetermined delay time tb determined by the electrostatic capacity of the capacitor C2. Further, the inverted internal clock signal $\overline{ecp}$ is rendered to have a predetermined pulse width tw2 determined by the electrostatic capacity of the capacitor C1. That is, the delay time tb covers the condition transition time of the flip-flop circuit BF1 and sets the rising timing of the inverted timing signal $\overline{\phi w}$. Further, the pulse width tw2 has a time width which sufficiently guarantees the level conversion operation of the level conversion circuit LC.

The inverted internal signal $\overline{wc}$ is inverted by the level conversion circuit LC, and is further converted to have the CMOS level to form an internal signal mwc.

In the write pulse generating circuit WPG, the internal signal mwc assumes the high level, and the inverted output signal, i.e., the inverted internal signal $\overline{wp}$ of the flip-flop circuit FF1 assumes the low level. At the same time, the non-inverted output signal, i.e., the internal signal wp assumes the high level. The flip-flop circuit FF1 maintains the set condition even after the internal signal mwc is returned back to the low level until the reset signal rwp assumes the high level. The inverted internal signal $\overline{wp}$ serves as an output signal, i.e., serves as an inverted timing signal $\overline{\phi w}$ of the write pulse generating circuit WPG through the bipolar CMOS composite drive circuit.

The reset signal rwp assumes the high level when the delay time td1 of the delay circuit DL1 has passed after the internal signal wp had assumed the high level and further when the delay time td2 of the delay circuit DL2 has passed. Therefore, the flip-flop circuit FF1 is reset, and the inverted internal signal $\overline{wp}$ and the inverted timing signal $\overline{\phi w}$ assume the high level. The reset signal rwp is returned back to the low level when the delay time td1 of the delay circuit DL1 has passed after the internal signal wp had assumed the low level.

As described above, the input operation of the memory with logic functions of this embodiment is synchronized according to the inverted clock signals $\overline{CP}$. When the memory with logic function assumes the write operation mode, the write pulse, i.e., the inverted timing signal $\phi w$ to be supplied to the write amplifier WA is formed autonomously by the timing generating circuit TG of the memory with logic functions after the write enable signal WE is received in response to the inverted clock signal $\overline{CP}$. The inverted clock signal $\overline{CP}$ has the ECL level and a very narrow pulse width in compliance with the operation limit of the ECL logic circuit. Further, the write pulse generating circuit WPG decreases the amount of power consumption and requires reduced area for layout, and can hence be constituted by the CMOS logic circuit. In the memory with logic functions of this embodiment, therefore, the inverted clock signal $\overline{CP}$ is input to the pulse width expander circuit PWE and the break thereof is delayed by a predetermined delay time tb so as to possess a pulse width tw2 such that the level conversion operation of the level conversion circuit LC can be stably carried out. The output signal of the pulse width expander circuit PWE is subjected to the AND operation together with the internal control signal formed according to the write enable signal WE, and is transmitted to the level conversion circuit LC and is further supplied to the write pulse generating circuit WPG. Therefore, despite the inverted clock signal $\overline{CP}$ has a very small pulse width, the level conversion circuit LC performs the level conversion operation stably and whereby operation of the write pulse generating circuit WPG is stabilized in the timing generating circuit TG.

The following effects are obtained when the present invention is adapted to a semiconductor integrated circuit device such as a memory with logic functions of ECL interface based fundamentally upon the bipolar CMOS-type RAM in accordance with the above-mentioned embodiment.

(1) A clock signal having a very narrow pulse width or an internal signal formed thereby is expanded for its width through the pulse width expander circuit, and is supplied to the level conversion circuit. The pulse width expander circuit expands the width of the clock signal having a narrow width so as to become nearly equal to or greater than the gate delay time tpd of the level conversion circuit. Therefore, the level conversion operation of the level conversion circuit is stabilized. Namely, the level of the clock signal or of the internal signal formed thereby is reliably converted into a predetermined signal level.

(2) Owing to the above item (1), operation of the write pulse generating circuit such as the memory with logic functions is stabilized and a write pulse is formed that satisfies the timing condition.

(3) Owing to the above items (1) and (2), the memory with logic functions including the write pulse generating circuit is prevented from operating erroneously, and the reliability is enhanced.

Figure 1:
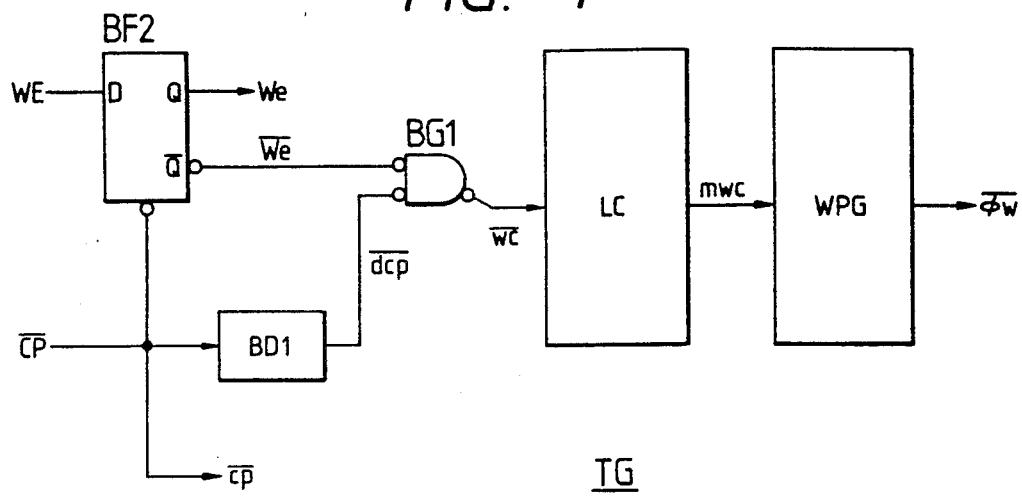
FIG. 1 is a diagram of a timing generating circuit of a memory with logic functions studied by the present inventors.

The invention accomplished by the present inventors was concretely described in the foregoing by way of an embodiment. However, the invention is in no way limited to the above embodiment only, but can be modified in a variety of other ways without departing from the spirit and scope of the invention. In the circuit of FIG. 1, for instance, the pulse width expander circuit PWE may be comprised of a plurality of bipolar gate circuits connected in series to determine the delay time tb and the pulse width tw2. Further, the CMOS inverter circuits may be provided in any number of stages to constitute the delay circuits DL1 and DL2 in the write pulse generating circuit WPG. The write enable signal WE, the inverted clock signal $\overline{CP}$ and the inverted timing signal $\overline{\phi w}$ may have logic conditions that can be inverted. If the polarity of the power source voltage can be inverted, the pulse width expander circuit PWE, level conversion circuit LC and write pulse generating circuit WPG can be constituted by using pnp-type transistors instead of npn-type transistors, and by replacing the p-channel MOSFET's and n-channel MOSFET's. In the block diagram of FIG. 2, the memory cells may be constituted by CMOS, and the memory array MARY may be constituted by a plurality of memory mats. Furthermore, a variety of embodiments can be employed such as the concrete circuit constitution of the timing generating circuit TG of FIG. 4, block constitution of the memory with logic functions shown in FIG. 2, and the combinations of control signals and timing signals.

The above description has dealt with the case where the invention accomplished by the present inventors was adapted to the write pulse generating circuit in a memory with logic functions in the field of art that served as the background of the present invention. The invention, however, is in no way limited thereto only, but can be further adapted to, for example, a clock distribution circuit or a like circuit in the memory with logic functions. In this case, for example, the inverted clock signal $\overline{CP}$ is expanded through the pulse width expander circuit PWE followed by the conversion of the level. The inverted clock signal $\overline{CP}$ is contracted again to the initial pulse width and is distributed as an internal clock signal to each of the circuits. Based on the inverted clock signal $\overline{CP}$ having a very small pulse width, therefore, it is made possible to obtain an internal clock signal of the CMOS level having a similar pulse width. The present invention can further be adapted to the bipolar CMOS-type RAM and to a variety of digital devices that include memory with logic functions. The present invention can be widely utilized for the semiconductor integrated circuit devices which require the processing for converting the levels of input signals having very narrow pulse widths.

Embodiment 2

Figure 11:
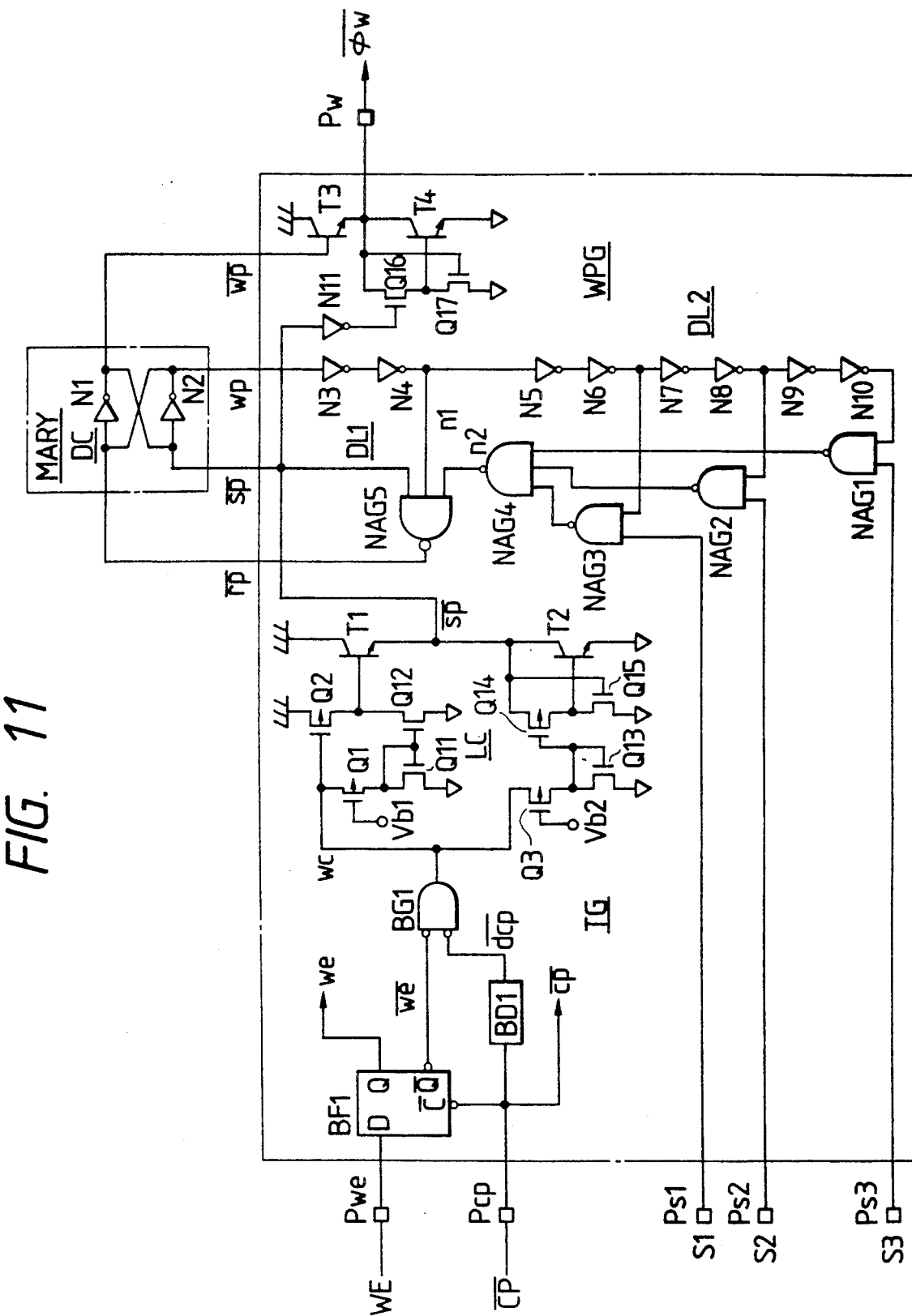
FIG. 11 is a diagram of a timing generating circuit of a memory with logic functions according to another embodiment of the present invention.

FIG. 11 illustrates another embodiment of the timing generating circuit TG shown in FIGS. 2 and 3. In the memory with logic functions of this embodiment, the memory array MARY and the memory mats MAT0 to MATn include the above-mentioned plurality of memory cells MC and a dummy cell constituted in the same manner as the memory cells. Though there is no particular limitation, the memory cells and the dummy cell are constituted based fundamentally upon a latch in which two CMOS inverter circuits are connected to each other in a crossing manner. That is, the high-resistance load-type static memory cell shown in FIG. 3 is changed into a CMOS static memory cell as explained below. That is the dummy cell is connected to neither the word line nor the complementary data lines, but is used as a circuit element that constitutes the write pulse generating circuit WPG in the timing generating circuit TG.

The write pulse generating circuit WPG shown in FIG. 11 includes the dummy cell and a delay circuit which forms a reset signal in response to the output signal of the dummy cell. Though there is no particular limitation, the delay time of the delay circuit is set stepwisely according to select signals S1 to S3 supplied via pads Ps1 to Ps3 in a predetermined step for testing the memory with logic functions. That is, the select signals S1 to S3 are utilized for determining the pulse width of the write pulse. The select signals S1 to S3 are selectively formed according to the operation characteristics of the dummy cell. That is, the pulse width of the write pulse is set and optimized depending upon the operation characteristics of the dummy cell, i.e., depending upon the operation characteristics of the memory cells that exhibit process variance like the dummy cells.

In FIG. 11, though there is no particular limitation, pads Pwe, Pcp, Ps1 to Ps3 and Pw that will be used in a predetermined step for testing the memory with logic functions are provided around the timing generating circuit TG. In a predetermined step for testing the memory with logic functions, furthermore, the write enable signal WE and the inverted clock signal $\overline{CP}$ are directly supplied from a testing device connected to an external unit through the corresponding pads Pwe and Pcp.

In the following description, the portions denoted by the same reference numerals (symbols) as those of FIG. 4 denote the same or corresponding portions unless otherwise stated.

The timing pulse generating circuit TG shown in FIG. 11 includes a flip-flop circuit BF1 that holds the write enable signal WE supplied from an external unit like the circuit of FIG. 4. The flip-flop circuit BF1 latches therein the write enable signal WE in response to the inverted clock pulse $\overline{CP}$ of the low level supplied from an external unit.

The inverted clock signal $\overline{CP}$ is further supplied to the input terminal of the delay circuit BD1 which, though there is no particular limitation, is based fundamentally upon a current switching circuit consisting of bipolar transistors. The output signal of the delay circuit BD1 is supplied as an inverted delay clock signal $\overline{dcp}$ to an input terminal of the NOR gate circuit BG1.

Though not specifically limited, the non-inverted output signal Q of the flip-flop circuit BF1 is supplied as an internal write enable signal we to other pulse generating circuits that are not shown in the timing generating circuit TG. The inverted output signal $\overline{Q}$ of the flip-flop circuit BF1 is supplied as an inverted internal write enable signal $\overline{we}$ to the other input terminal of the NOR gate circuit BG1 which is based fundamentally upon an ECL series gate circuit consisting of bipolar transistors.

As described earlier, the input operation of the memory with logic functions of this embodiment is synchronized in accordance with the inverted clock signals $\overline{CP}$. Further, the operation mode of the memory with logic functions selectively assumes the read mode or the write mode in compliance with the write enable signal WE which is received by the flip-flop circuit BF1 at the breaking edge of the inverted clock signal $\overline{CP}$.

The output signal, i.e., the internal signal wc of the NOR gate circuit BG1 is supplied to the gate of the p-channel MOSFET Q2 of the level conversion circuit LC and is further supplied to the sources of p-channel MOSFET's Q1 and Q3 of the level conversion circuit LC. The internal signal wc usually assumes the high level, and is selectively rendered to assume the high level when both the inverted internal write enable signal $\overline{we}$ and the inverted delay clock signal $\overline{dcp}$ assume the low level.

Though not specifically limited, the level conversion circuit LC includes two bipolar transistors T1 and T2 that are provided in the form of a totem pole between the ground potential of the circuit and the power source voltage. Though not specifically limited, the power source voltage of the circuit has, for example, negative polarity and is $-5.2$ V. The MOSFET Q2 is provided between the base of the transistor T1 and the ground potential of the circuit, and an n-channel MOSFET Q12 is provided between the base of the transistor T1 and the power source voltage of the circuit. The gate of the MOSFET Q12 is connected to the gate of an n-channel MOSFET Q11 and the drain thereof. The source of the MOSFET Q11 is connected to the power source voltage of the circuit. The MOSFET Q1 is provided between the drain of the MOSFET Q11 and the gate of the MOSFET Q2. Though not specifically limited, the MOSFET Q1 is served with a predetermined bias voltage Vb1 through the gate thereof. Therefore, the MOSFET's Q1 and Q11 so work that the MOSFET Q12 will possess a predetermined logic threshold determined by the bias voltage Vb1 for the internal signal wc.

An n-channel MOSFET Q14 is provided between the base and the collector of the transistor T2, and an n-channel MOSFET Q15 is provided between the base of the transistor T2 and the power source voltage of the circuit. The gate of the MOSFET Q15 is connected to the collector of the transistor T2. An n-channel MOSFET Q13 is provided between the gate of the MOSFET Q14 and the power source voltage of the circuit. A MOSFET Q13 has its gate and drain connected to each other to work like a diode. The MOSFET Q3 is provided between the drain of the MOSFET Q13 and the gate of the MOSFET Q2. Though there is no particular limitation, the MOSFET Q3 is served with a predetermined bias voltage Vb2 through the gate thereof. Therefore, the MOSFET's Q3 and Q13 so work that the MOSFET Q14 will possess a predetermined logic threshold determined by the bias voltage Vb2 for the internal signal we.

The potential at the node where the emitter of the transistor T1 and the collector of the transistor T2 are connected together is supplied to the write pulse generating circuit WPG as an output signal, i.e., as an inverted set signal $\overline{sp}$ of the level conversion circuit LC.

When the above internal signal wc has a predetermined low level, the MOSFET's Q12 and Q14 are rendered non-conductive and the MOSFET Q2 conductive. Therefore, the transistor T1 is rendered conductive and the transistor T2 nonconductive. The output signal, i.e., inverted set signal $\overline{sp}$ of the level conversion circuit LC, therefore, assumes a high CMOS level nearly equal to ground potential of the circuit. On the other hand, as the internal signal wc assumes a predetermined high level, the MOSFET Q2 is rendered nonconductive and, instead, the MOSFET's Q12 and Q14 are both rendered conductive. The transistor T1 is rendered nonconductive since the base current is interrupted and the base capacity is discharged. The transistor T2, on the other hand, is rendered conductive since the base current continues to flow through the MOSFET Q14 until the collector potential drops sufficiently. Therefore, the output signal, i.e., inverted set signal $\overline{sp}$ of the level conversion circuit LC assumes the low CMOS level such as power source voltage of the circuit.

Though not specifically limited, the write pulse generating circuit WPG is constituted based fundamentally upon the dummy cells DC provided in the memory array MARY. As described earlier, the dummy cell DC is constituted in the same manner as other memory cells in the memory array MARY, and exhibits nearly the same operation characteristics as that of the memory cells. The dummy cell DC includes two CMOS inverter circuits N1 and N2 that are connected to each other in a crossing manner in a latch form. The input terminal of the inverter circuit N2 serves as an inverted set input terminal of the dummy cell DC and is served with the inverted set signal $\overline{sp}$ from the level conversion circuit LC. The inverted set signal $\overline{sp}$ is further supplied to the first input terminal of the NAND gate circuit NAG5, inverted through the inverter circuit N11, and is supplied to the gate of the N-channel MOSFET Q16.

On the other hand, the input terminal of the inverter circuit N1 serves as an inverted reset input terminal of the dummy cell DC and is served with an output signal, i.e., inverted reset signal $\overline{rp}$ of the NAND gate circuit NAG5. The output signal of the inverter circuit N1 is supplied to the input terminal of the inverter circuit N2, and is further supplied to the base of the output transistor T3 as an inverted output signal $\overline{wp}$ of the dummy cell DC. Likewise, the output signal of the inverter circuit N2 is supplied to the input terminal of the inverter circuit N1, and is further supplied to the input terminal of the inverter circuit N3 as a non-inverted output signal wp of the dummy cell DC.

The inverter circuit N3 works as a delay element together with the inverter circuit N4 connected in series therewith, and constitutes the delay circuit DL1. As will be described later, the delay time td1 of the delay circuit DL1 determines the pulse width of the inverted reset signal $\overline{rp}$. The delay time td1 further determines the pulse width of the inverted timing signal $\overline{\phi w}$ together with the delay time td2 of the delay circuit DL2. The output signal of the inverter circuit N4, i.e., the output signal n1 of the delay circuit DL1 is supplied to the second input terminal of the NAND gate circuit NAG5 and is further supplied to the input terminal of the inverter circuit N5.

The inverter circuit N5 works as a delay element together with the inverter circuits N6 to N10 that are connected in series. These inverter circuits N5 to N10 constitute the delay circuit DL2 together with the NAND gate circuits NAG1 to NAG4. Output signal of the inverter circuit N6 is supplied to the input terminal of the inverter circuit N7, and is further supplied to one input terminal of the NAND gate circuit NAG3. Further, output signal of the inverter circuit N8 is supplied to the input terminal of the inverter circuit N9 and to one input terminal of the NAND gate circuit NAG2. Output signal of the inverter circuit N10 is supplied to one input terminal of the NAND gate circuit NAG1. Other input terminals of these NAND gate circuits NAG3, NAG2 and NAG1 are served with corresponding select signals S1 to S3 via pads Ps1 to Ps3. Though there is no particular limitation in FIG. 11, the select signals S1 to S3 are selectively rendered to assume the high level or the low level as the pads Ps1 to Ps3 are bonded to ground potential or power source voltage of the circuit depending upon the determined result of the characteristics testing that will be described later.

Output signals of the NAND gate circuits NAG3, NAG2 and NAG1 are supplied to the first to third input terminals of the NAND gate circuit NAG4. Therefore, the output signal of the NAND gate circuit NAG4, i.e., the output signal n2 of the delay circuit DL2 is selectively rendered to assume the high level when any one of the output signals of NAND gate circuits NAG3, NAG2 and NAG1 assumes the low level, i.e., when the output signal and select signal S1 of the inverter circuit N6 have the high level, when the output signal and select signal S2 of the inverter circuit N8 have the high level, or when the output signal and select signal S3 of the inverter circuit N10 have the high level. That is, when the select signal S1 has the high level, the non-inverted output signal wp of the dummy cell DC delayed by the inverter circuits N3 and N4 is further delayed by the delay times of the two inverter circuits N5 and N6, and is produced as an output signal n2 of the delay circuit DL2. When the select signal S2 or S3 has the high level, furthermore, the non-inverted output signal wp of the dummy cell DC is delayed by the delay times of the four inverter circuits N5 to N8 or of the six inverter circuits N5 to N10, to form an output signal n2 of the delay circuit DL2. Therefore, the delay time td2 of the delay circuit DL2 is allowed to posssess a plurality of values stepwisely set according to select signals S1 to S3. As will be described later, the delay time td2 of the delay circuit DL2 determines the pulse width of the inverted timing signal $\overline{\phi w}$ together with the delay time td1 of the delay circuit DL1.

The output signal of the NAND gate circuit NAG4, i.e., the output signal n2 of the delay circuit DL2 is supplied to the third input terminal of the NAND gate circuit NAG5 which produces a signal that will be supplied as an inverted reset signal $\overline{rp}$ to the inverted reset input terminal of the dummy cell DC.

When the inverted set signal $\overline{sp}$ temporarily assumes the low CMOS level, the output signal, i.e., the inverted reset signal $\overline{rp}$ of the NAND gate circuit NAG5 assumes the high level. Hence, the output signal of the inverter circuit N2, i.e., the non-inverted output signal wp of the dummy cell DC assumes the high level, and the output signal of the inverter circuit N1 assumes the low level, i.e., the inverted output signal $\overline{wp}$ of the dummy cell DC assumes the low level. Therefore, the dummy cell DC is placed under the so-called set condition. Even after the inverted set signal $\overline{sp}$ is returned back to the high level, the dummy cell DC maintains the set condition until the inverted reset signal $\overline{rp}$ assumes the low level.

As the dummy cell DC is set and the non-inverted output signal wp assumes the high level, the output signal n1 of the delay circuit DL1 assumes the high level at a moment when the delay time td1 has passed, and the output signal n2 of the delay circuit DL2 assumes the high level at a moment when the resultant delay time td1+td2 of the delay circuits DL1 and DL2 has passed. In this case, since the inverted set signal $\overline{sp}$ is already assuming the high level, the inverted reset signal $\overline{rp}$ assumes the high level. The output signal of the inverter circuit N1, i.e., the inverted output signal $\overline{wp}$ of the dummy cell DC assumes the high level, and the output signal of the inverter circuit N2 assumes the low level, i.e., the non-inverted output signal wp of the dummy cell DC assumes the low level. Accordingly, the dummy cell DC is placed under the so-called reset condition. The dummy cell DC maintains the reset condition until the inverted set signal $\overline{sp}$ assumes the low level in the next time.

As the dummy cell DC is reset and the non-inverted output signal wp thereof assumes the low level, the output signal of the inverter circuit N4, i.e., the output signal n1 of the delay circuit DL1 assumes the low level being delayed by the delay time td1. Hence, the output signal, i.e., the inverted reset signal $\overline{rp}$ of the NAND gate circuit NAG5 is returned back to the high level.

The dummy cell DC therefore is set when the output signal of the level conversion circuit LC, i.e., the inverted set signal $\overline{sp}$ temporarily assumes the low level, and is reset when the inverted reset signal $\overline{rp}$ tempolarily assumes the low level at a moment the resultant delay time td1 td2 of the delay circuits DL1 and D12 has lapsed. In other words, the non-inverted output signal wp of the dummy cell DC breaks in synchronism with the breaking edge of the inverted set signal $\overline{sp}$, and forms a negative pulse having a pulse width corresponding to the resultant delay time td1+td2 of the delay circuits DL1 and DL2. As mentioned above, the delay time td2 of the delay circuit DL2 is set according to the select signals S1 to S3, and the pulse width of the non-inverted output signal wp is set accordingly. The inverted reset signal $\overline{rp}$ breaks when the resultant delay time td1+td2 of the delay circuits DL1 and DL2 has passed after the dummy cell DC had been set, and forms a negative pulse with a pulse width equal to the delay time td1 of the delay circuit DL1.

The write pulse generating circuit WPG includes a bipolar CMOS composite drive circuit based fundamentally on the bipolar transistors T3 and T4 that are provided in the form of a totem pole. The collector of the transistor T3 is connected to ground potential of the circuit, and the base thereof is served with an inverted output signal $\overline{wp}$ from the dummy cell DC. The emitter of the transistor T4 is connected to the power source voltage of the circuit. Further, an n-channel MOSFET Q16 is provided between the base and the collector of the transistor T14, and an n-channel MOSFET Q17 is provided between the source of the transistor T4 and power source voltage of the circuit. Though not specifically limited, the MOSFET Q16 is served through the gate thereof with a signal obtained by inverting the above inverted set signal $\overline{sp}$ through the inverter circuit N11. The gate of the MOSFET Q17 is connected to the collector of the output transistor T4. The potential at the node where the emitter of the transistor T3 and the collector of the transistor T4 are connected together serves as an output signal, i.e., serves as an inverted timing signal $\overline{\phi w}$ of the write pulse generating circuit WPG. Though not specifically limited, the inverted timing signal $\overline{\phi w}$ is supplied via pad Pw to the write amplifier WA of the memory with logic functions.

When the dummy cell DC is reset and the inverted set signal $\overline{sp}$ assumes the high level, the inverted output signal $\overline{wp}$ of the dummy cell DC assumes the high level and the output signal of the inverter circuit N11 assumes the low level. Accordingly, the transistor T3 is rendered conductive and the transistor T4 is rendered nonconductive since the MOSFET Q16 is turned off and no base current flows. The inverted timing signal $\overline{\phi w}$ therefore assumes the high CMOS level such as ground potential of the circuit. As the inverted set signal $\overline{sp}$ assumes the low level and the dummy cell DC is set, the transistor T3 is rendered nonconductive and, instead, the transistor T4 conductive. Therefore, the inverted timing signal $\overline{\phi w}$ assumes the low CMOS level such as power source voltage of the circuit. Thus, the bipolar CMOS composite drive circuit helps increase the output signal of the write pulse generating circuit WPG, i.e., helps increase the fan out of the inverted timing signal $\overline{\phi w}$.

Figure 12:
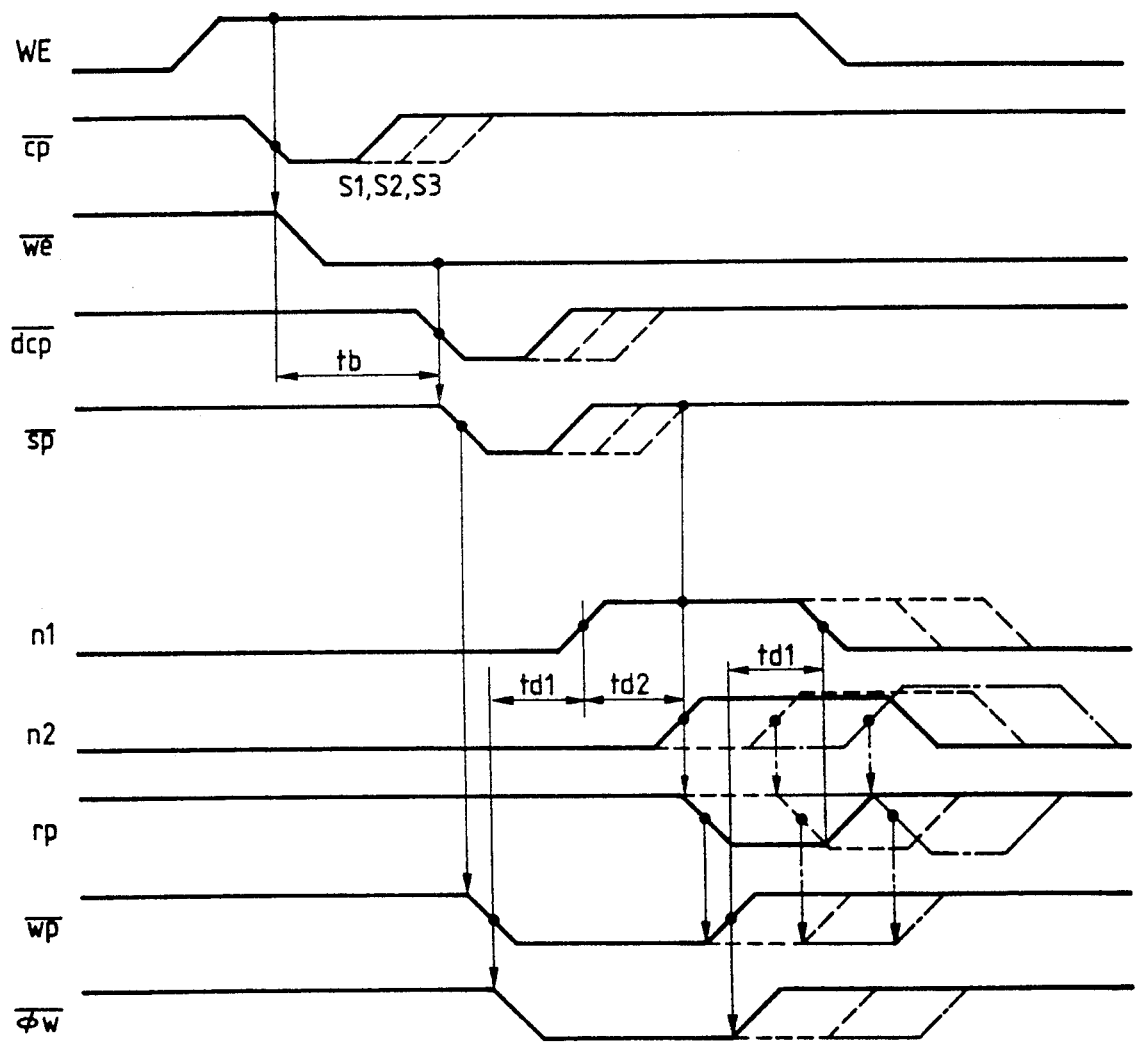
FIG. 12 is a diagram showing the timings of the timing generating circuit of FIG. 11.

FIG. 12 is a diagram illustrating the timings of the timing generating circuit TG of FIG. 11. Operation of the timing generating circuit TC of this embodiment will be briefly described in conjunction with FIGS. 11 and 12. In FIG. 12, the cases where the select signal S1 has the high level are indicated by solid lines and the cases where the select signal S2 or S3 has the high level are indicated by dotted lines or dot-chain lines.

In FIG. 12, the memory with logic fucntions assumes the write operation mode as the write enable signal WE assumes the high level prior to break of the inverted clock signal $\overline{CP}$.

In the timing generating circuit TG, the flip-flop circuit BF1 is set since the write enable signal WE assumes the high level at the breaking edge of the inverted clock signal $\overline{CP}$, and the inverted output signal thereof, i.e., the inverted internal write enable signal $\overline{we}$ assumes the low level. The inverted internal write enable signal $\overline{we}$ is subjected to the AND operation of negative logic together with the inverted delay clock signal $\overline{dcp}$ through the bipolar gate circuit BG1, and whereby the internal signal wc is formed. The inverted delay clock signal $\overline{dcp}$ is delayed behind the inverted clock signal $\overline{CP}$ by the delay time tb of the delay circuit BD1. The delay time tb covers the condition transition time of the flip-flop circuit BF1, and sets the rising timing of the inverted timing signal $\phi w$.

The internal signal wc is inverted by the level conversion circuit LC and forms an inverted set signal $\overline{sp}$ of the CMOS level.

In the write pulse generating circuit WPG, the inverted set signal $\overline{sp}$ assumes the low level so that the non-inverted output signal wp of the dummy cell DC assumes the high level and, then, the inverted output signal $\overline{wp}$ assumes the low level. Even after the inverted set signal $\overline{sp}$ is returned back to the high level, the dummy cell DC maintains the set condition until the inverted reset signal $\overline{rp}$ assumes the low level. The inverted output signal $\overline{wp}$ of the dummy cell DC serves as an output signal, i.e., serves as an inverted timing signal $\overline{\phi w}$ of the write pulse generating circuit WPG through the bipolar CMOS composite drive circuit.

When the delay time td1 of the delay circuit DL1 lapses after the inverted output signal $\overline{wp}$ of the dummy cell DC had assumed the low level and the non-inverted output signal wp thereof the high level, the output signal n1 of the delay circuit DL1 assumes the high level. Further, when the delay time td2 of the delay circuit DL2 lapses after the output singal n1 of the delay circuit DL1 had assumed the high level, the output signal n2 of the delay circuit DL2 assumes the high level. The inverted reset signal $\overline{rp}$ then assumes the low level. The dummy cell DC therefore is reset, the inverted output signal $\overline{wp}$ assumes the high level and the non-inverted output signal assumes the low level. Accordingly, the inverted timing signal $\overline{\phi w}$ assumes the high level. The inverted reset signal $\overline{rp}$ is returned back to the low level when the delay time td1 of the delay circuit DL1 has lapsed after the non-inverted output signal wp of the dummy cell DC had assumed the low level.

As described earlier, the delay circuit DL2 of the write pulse generating circuit WPG is selectively served with the select signals S1 to S3 via pads Ps1 to Ps3 depending upon the operation characteristics of the dummy cell DC. As a result, the delay time td2 of the delay circuit DL2 can be set to values that differ stepwisely depending upon the select signals S1 to S3. Though there is no particular limitation, operation characteristics of the dummy cell DC are determined by changing the pulse width of the inverted clock signal $\overline{CP}$ while monitoring the inverted timing signal $\overline{\phi w}$ as shown in FIG. 12. That is, when variance develops as the dummy cell DC exhibits good operation characteristics and when the transmission delay time is short, the dummy cell DC is triggered by the inverted clock signal $\overline{CP}$ having a short pulse width, and the inverted timing signal $\phi w$ having a predetermined pulse width is produced On the other hand, when variance develops as the dummy cell DC exhibits poor operation characteristics and when the transmission delay time is long, the dummy cell DC is not inverted by a short inverted clock signal $\overline{CP}$ and the inverted timing signal $\phi w$ is not formed.

As described earlier, the dummy cell DC is so designed as to exhibit the same operation characteristics as those of other memory cells that constitute the memory array MARY. Therefore, determining the operation characteristics of the dummy cell DC by changing the pulse width of the inverted clock signal $\overline{CP}$ is equal to determining the operation characteristics of the memory cells that serve as memory elements.

In the embodiment of FIG. 12, the pulse width of the inverted clock signal $\overline{CP}$ is changed into three steps, and the select signals S1 to S3 are supplied depending upon the pulse widths of the inverted clock signals $\overline{CP}$. The select signals S1 to S3 are selectively fixed to the high level or the low level in the next step of fabrication when the corresponding pads Ps1 to Ps3 are bonded to the ground potential or the power source voltage of the circuit. As a result, the write pulse, i.e., the inverted timing signal w of the memory with logic functions possesses an effective pulse width in accordance with the operation characteristics of the memory cell.

As described above, the operation of the memory with logic functions according to this embodiment is synchronized according to the inverted clock signal $\overline{CP}$, and the write pulse, i.e., inverted timing signal $\overline{\phi w}$ supplied to the write amplifier WA is autonomously formed by the write pulse generating circuit WPG provided in the timing generating circuit TG. The memory array MARY includes a dummy cell DC that is constituted in the same manner as the memory cell. The write pulse generating circuit WPG includes the dummy cell DC and the delay circuit that forms an inverted reset signal $\overline{rp}$ according to the non-inverted output signal of the dummy cell DC. The delay time of the delay circuit that determines the pulse width of the inverted timing signal $\overline{\phi w}$ is set to a value that differs stepwise according to the operation characteristics of the dummy cell DC, i.e., the memory cell. Therefore, in the memory with logic functions of this embodiment, the write pulse having a pulse width corresponding to the operation characteristics of the memory cells can be efficiently formed despite the write pulse generating circuit WPG is constituted relatively simply. Therefore, the number of testing steps can be decreased to decrease the cost for manufacturing the memory with logic functions, and the margin of the write pulses can be reduced to increase the operation speed of the memory with logic functions.

As described in the foregoing embodiment, the effects are obtained as described below when the present invention is adapted to a semiconductor integrated circuit device such as a memory with logic functions of an ECL interface constituted based fundamentally on the bipolar CMOS RAM.

(1) The memory array is provided with dummy cells constituted in the same manner as the memory cells, the write pulse generating circuit is constituted based primarily upon the dummy cell and a delay circuit that forms a reset signal in response to the output signal of the dummy cell, and the delay time of the delay circuit is set according to the operation characteristics of the dummy cell, such that the pulse width of the write pulse can be efficiently set to meet the operation characteristics of the memory cells.

(2) Owing to the above item (1), the number of steps for testing the memory with logic functions can be reduced and the manufacturing cost can be decreased.

(3) Owing to the above item (1), the pulse width of the write pulse supplied to the write amplifier can be optimized according to the operation characteristics of the memory cell and the margin thereof can be decreased, making it possible to increase the operation speed of the memory with logic functions.

In the foregoing was concretely described the invention accomplished by the present inventors by way of embodiments. However, it needs not be pointed out that the present invention is in no way limited to the above embodiments only but can be modified in a variety of other ways without departing from the spirit and scope of the invention. In the embodiment of FIG. 11, for instance, the CMOS inverter circuits may be provided in any number of stages to constitute the delay circuits DL1 and DL2. Further, these delay circuits may be constituted by the inverter circuits of the NMOS type, bipolar CMOS type or of any other types. The write enable signal WE, inverted clock signal $\overline{CP}$ and inverted timing signal $\overline{\phi w}$ may be those of which the logic conditions are inverted. The gate of MOSFET Q16 of the write pulse generating circuit WPG may be served with the non-inverted output signal wp of the dummy cell DC instead of the signal inverted from the inverted set signal $\overline{sp}$ by the inverter circuit N11. The level conversion circuit LC and the write pulse generating circuit WPG may be constituted by the MOSFET's and bipolar transistors of opposite type of conductivities provided the polarity of the power source voltage can be inverted. The select signals S1 to S3 may be selectively supplied by selectively cutting the connection wirings that are formed in advance between the pads Ps1 to Ps3 and the ground potential or the power source voltage of the circuit, using, for example, a laser beam. In FIG. 11, the memory cells and the dummy cells DC constituting the memory array MARY may be those constituted by an inverter circuit of the high-resistance load type. Further, the dummy cell may be any one of those that are formed in a plurality of numbers over one row or column in the memory array MARY. The memory array MARY may be constituted by a plurality of memory mats. Furthermore, the timing generating circuit TG shown in FIG. 11 and the combination of control signals and timing signals may be realized in a variety of forms.

Moreover, the delay circuit BD1 shown in FIG. 11 may be modified into the pulse width expander circuit PWE shown in FIG. 4.

In the foregoing was chiefly described the case where the invention accomplished by the present inventors was adapted to the memory with logic functions in the field of art that served as the background of the invention. However, the invention is in no way limited thereto only but can be adapted to a variety of digital devices that are used as bipolar CMOS RAM's or that include a memory with logic functions. The present invention can be widely adapted to semiconductor memory devices that include write pulse generating circuit or to digital devices that includes a semiconductor memory device.

What is claimed is:

1. A semiconductor integrated circuit device comprising:
    a first terminal to which an external control signal is to be supplied;
    a second terminal to which a pulse signal having a first signal level and a first pulse width is to be supplied;
    latch means coupled to receive said external control signal and responsive to said pulse signal for latching a level of said external control signal;
    pulse width expander means coupled to receive said pulse signal and for expanding the first pulse width of said pulse signal into a second pulse width wider than the first pulse width upon receipt of said pulse signal, said pulse width expander means including output means for outputting an output signal having the first signal level and the second pulse width;

a gate circuit having a first input coupled to an output of said latch means and a second input coupled to receive the output signal of said pulse width expander means, and for providing a first internal control signal having the first signal level and the second pulse width in response to reception of said output signal of said pulse width expander means;

level conversion means coupled to receive said first internal control signal and for converting the first signal level of said first internal control signal into a second signal level greater than the first signal level, the level conversion means including output means for outputting a second internal control signal having the second signal level and the second pulse width;

a pulse generator coupled to receive said second internal control signal for providing a timing signal based on said second internal control signal; and an internal circuit responsive to said timing signal, wherein an operation of said internal circuit is controlled by said timing signal.

2. A semiconductor integrated circuit device according to claim 1, wherein said gate circuit includes an ECL circuit, wherein said level conversion means includes an input stage of an MOS circuit and an output stage of a bipolar circuit, and wherein said pulse generator includes CMOS circuits.

3. A semiconductor integrated circuit device according to claim 1, wherein the first level is an ECL level and the second level is a CMOS level.

4. A semiconductor integrated circuit device according to claim 3, wherein the second pulse width has a time width of a predetermined duration to permit satisfactory completion of a level conversion operation by said level conversion means.

5. A semiconductor integrated circuit device according to claim 1, wherein said internal circuit includes memory means which performs a predetermined operation in response to said timing signal.

6. A semiconductor integrated circuit device according to claim 5, wherein said memory means includes a plurality of memory cells, select means coupled to receive an address signal and for selecting at least one memory cell according to said address signal out of said plurality of memory cells, and data write means for writing predetermined data into said at least one memory cell selected by said select means in response to said timing signal.

7. A semiconductor integrated circuit device according to claim 6, wherein each of said memory cells includes a static memory cell.

8. A circuit for use in an integrated circuit device with a memory circuit for providing a write pulse signal defining an operation period of a write circuit in the memory circuit of the integrated circuit device, the circuit comprising:

a first terminal for receiving a write enable signal indicating a write mode of the memory circuit;
a second terminal for receiving a clock signal;
latch means coupled to the first and second terminals for storing and generating an internal write enable signal indicating the write mode in response to the clock signal applied to the second terminal changing from a first predetermined voltage level to a second predetermined voltage level, wherein the clock signal thereafter changes to the first predetermined voltage level to have a predetermined period so that said clock signal has a first state where the clock signal is at the first predetermined voltage level and a second state where the clock signal is at the second predetermined voltage level, wherein the clock signal has a first signal level corresponding to a potential difference between the first and second predetermined voltage levels, and wherein a time when the clock signal is in the first state is longer than a time when the clock signal is in the second state;

delay means coupled to the second terminal for generating an internal delayed clock signal in-phase delayed with respect to the clock signal, the internal delayed clock signal having the first signal level, the first state and the second state, wherein a time when the internal delayed clock signal is in the second state is longer than the time when the clock signal is in the second state;

a gate circuit coupled to the latch means and to the delay means and responsive to the internal delayed clock signal for producing an internal pulsed write enable signal having the first signal level, the first state and the second state, wherein a time when the internal pulsed write enable signal is in the second state is substantially equivalent to the time when the internal delayed clock signal is in the second state;

level converting means coupled to the gate circuit for supplying an internal converted write control signal having a third predetermined voltage level when the internal pulsed write enable signal is at the first state, and having a fourth predetermined voltage level when the internal pulsed write enable signal is at the second state, in response to the internal pulsed write enable signal, wherein the internal converted write control signal has a second signal level corresponding to a different potential level between the third and fourth predetermined voltage levels, the second signal level being greater than the first signal level; and generating means coupled to the level converting means and responsive to the internal converted write control signal and for providing the write pulse signal having a predetermined timing required by the write circuit in the memory circuit.

9. A circuit according to claim 8, wherein the gate circuit includes an ECL circuit, wherein the the level converting means includes an input stage of an MOS circuit and an output stage of a bipolar circuit, and wherein the generating means includes CMOS circuits.

10. A circuit according to claim 8, wherein the first signal level is an ECL level and the second signal level is a CMOS level.

11. An integrated digital device which includes a memory circuit having a write mode, comprising:

a first terminal for receiving a write enable signal indicating the write mode of the memory circuit;
a second terminal for receiving a periodic clock signal having a first signal level, first states and second states, a period of each first state being longer than a period of each second state;
latch means coupled to the first and second terminals for providing an internal write enable signal indicating the write mode in response to the periodic clock signal applied to the second terminal changing from the first state to the second state;
delay means coupled to the second terminal for generating an internal delayed clock signal in-phase delayed with respect to the periodic clock signal, the internal delayed clock signal having the first signal level, the first state and the second state, a period of the second state in which is longer than the period of the second state in the periodic clock signal;

gate means coupled to the latch means and to the delay means for producing a pulsed write enable signal having the first signal level, a third state indicating the write mode when the internal delayed clock signal is at a second state and a fourth state when the internal delayed clock signal is at a first state, a period of the third state being substantially equivalent to the period of the second state in the internal delayed clock signal;

a level converting circuit coupled to the gate means for supplying a write control signal having a second signal level greater than the first signal level, a fifth state indicating the write mode when the pulsed write enable signal is at a third state and a sixth state when the pulsed write enable signal is at a fourth state, a period of the fifth state being substantially equivalent to the period of the third state in the pulsed write enable signal, wherein the level converting circuit has a predetermined gate delay time, and the period of the second state in the internal delayed clock signal is substantially equal to or greater than the predetermined gate delay time of the level converting circuit; and means coupled to the level converting circuit and responsive to the write control signal and for generating a write pulse signal defining a write time of the memory circuit.

12. An integrated digital device according to claim 11, wherein the gate means includes an ECL circuit, wherein the level converting circuit includes an input stage of an MOS circuit and an output stage of a bipolar circuit, and wherein the means coupled to the level converting circuit includes CMOS circuits.

13. An integrated digital device according to claim 11, wherein the first signal level is an ECL level and the second signal level is a CMOS level.

* * * * *